(12) United States Patent
Ohama et al.

(10) Patent No.: US 9,386,183 B2
(45) Date of Patent: Jul. 5, 2016

(54) IMAGE SENSOR

(71) Applicant: Mitsubishi Electric Corporation, Chiyoda-ku (JP)

(72) Inventors: Daisuke Ohama, Chiyoda-ku (JP); Akiko Fujiuchi, Chiyoda-ku (JP); Seiichi Matsumura, Chiyoda-ku (JP); Atsushi Ito, Chiyoda-ku (JP); Masaru Imaizumi, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/400,172

(22) PCT Filed: Apr. 19, 2013

(86) PCT No.: PCT/JP2013/061602
§ 371 (c)(1),
(2) Date: Nov. 10, 2014

(87) PCT Pub. No.: WO2013/168537
PCT Pub. Date: Nov. 14, 2013

(65) Prior Publication Data
US 2015/0136951 A1    May 21, 2015

(30) Foreign Application Priority Data
May 10, 2012    (JP) ................. 2012-108725

(51) Int. Cl.
H01J 40/14    (2006.01)
H04N 1/193    (2006.01)
H04N 1/028    (2006.01)
H04N 1/031    (2006.01)
H01L 27/146    (2006.01)

(52) U.S. Cl.
CPC ........ *H04N 1/1936* (2013.01); *H01L 27/14627* (2013.01); *H04N 1/02815* (2013.01); *H04N 1/02835* (2013.01); *H04N 1/0318* (2013.01);
(Continued)

(58) Field of Classification Search
CPC ..... H04N 1/192; H04N 1/193; H04N 1/1935; H04N 1/1936
USPC ........ 250/208.1, 216, 239; 358/474, 476, 482
See application file for complete search history.

(56) References Cited

U.S. PATENT DOCUMENTS

| 5,489,995 A | 2/1996 | Iso et al. | |
| 2008/0135759 A1* | 6/2008 | Yoshimura | H04N 1/02815 250/338.1 |
| 2009/0199375 A1 | 8/2009 | Koelling et al. | |

FOREIGN PATENT DOCUMENTS

| CN | 100550983 C | 10/2009 |
| EP | 0 573 984 A1 | 12/1993 |

(Continued)

OTHER PUBLICATIONS

Korean Office Action issued Apr. 27, 2015 in Patent Application No. 10-2014-7030852 (with English Translation).
Combined Taiwanese Office Action and Search Report issued Feb. 9, 2015 in Patent Application No. 102114130 (with English language translation and English translation of categories of cited documents).
International Search Report Issued Jul. 30, 2013 in PCT/JP13/061602 Filed Apr. 19, 2013.
Extended European Search Report issued Dec. 21, 2015 in Patent Application No. 13787250.3.

*Primary Examiner* — Kevin Pyo
(74) *Attorney, Agent, or Firm* — Oblon, McClelland, Maier & Neustadt, L.L.P.

(57) ABSTRACT

An image sensor including: light guides for irradiating light onto an irradiated object; a lens that focuses reflected light that was reflected by the irradiated object; a sensor that receives the reflected light that was focused by the lens; and a housing. The housing houses or holds the light guides, the lens, and the sensor, and is formed by integrating a housing metal portion and a housing resin portion.

20 Claims, 26 Drawing Sheets

(52) U.S. Cl.
CPC *H04N 2201/0081* (2013.01); *H04N 2201/0082* (2013.01); *H04N 2201/0094* (2013.01); *H04N 2201/0246* (2013.01); *H04N 2201/02456* (2013.01); *H04N 2201/02458* (2013.01); *H04N 2201/02462* (2013.01); *H04N 2201/02464* (2013.01); *H04N 2201/02466* (2013.01); *H04N 2201/02481* (2013.01); *H04N 2201/02483* (2013.01); *H04N 2201/0312* (2013.01); *H04N 2201/03112* (2013.01); *H04N 2201/03125* (2013.01); *H04N 2201/03133* (2013.01); *H04N 2201/03141* (2013.01); *H04N 2201/03145* (2013.01)

(56) References Cited

FOREIGN PATENT DOCUMENTS

| | | |
|---|---|---|
| JP | 6 22086 | 1/1994 |
| JP | 7 131585 | 5/1995 |
| JP | 8 307597 | 11/1996 |
| JP | 2008 227815 | 9/2008 |
| TW | 200708081 A | 2/2007 |
| TW | 200740187 A | 10/2007 |
| TW | 1378712 B | 12/2012 |

* cited by examiner

IMAGE SENSOR

TECHNICAL FIELD

The present disclosure relates to an image sensor that is used in an image reading device such as a copier or a multi-function printer.

BACKGROUND ART

Contact image sensors that are used in image reading devices such as copiers or multi-function printers are advancing in terms of increased precision of reading depth and higher resolution. Therefore, in an optical system for a contact image sensor, construction is desired in which the relative positional relationship of a document, a lens and sensor is regulated with high precision. Unexamined Japanese Patent Application Kokai Publication No. H07-131585 (see Patent Literature 1) discloses technology in which this relative positional relationship is regulated with high precision by installing a rod lens, a document glass and a sensor-mounted board as optical elements on a high-precision member that is formed by aluminum extrusion molding or pressing of steel plate.

Moreover, in the optical system of a contact image sensor, light that is reflected from the document, passes through a lens and reaches the sensor, is converted by the sensor to an electrical signal so that information in the document is converted to the electrical signal. However, when there is divergence of the optical axis, irregular reflection of light occurs by the light that passes through the lens hitting a location other than the sensor, and that light arrives at the sensor as stray light, causing the image reading performance to become poor. Unexamined Japanese Patent Application Kokai Publication No. H08-307597 (see Patent Literature 2) discloses an imaging device in which a rod lens array that focuses the light rays that are reflected from the surface of the document is held between a frame and a holder. The holder keeps the light rays that are irradiated by an LED chip from directly entering into a light-receiving sensor. As a result, this imaging device prevents divergence of the optical axis and suppresses stray light.

As the light output from light sources of contact image sensors becomes greater, there is a need for efficient heat-dissipating construction. Unexamined Japanese Patent Application Kokai Publication No. 2008-227815 (see Patent Literature 3) discloses, as illustrated in FIG. 4, heat-dissipating construction in which an LED chip is mounted on a metal plate, and bent heat-dissipating plates are attached to a flat section on the reflecting-surface side of the LED chip.

CITATION LIST

Patent Literature

Patent Literature 1: Unexamined Japanese Patent Application Kokai Publication No. H07-131585
Patent Literature 2: Unexamined Japanese Patent Application Kokai Publication No. H08-307597
Patent Literature 3: Unexamined Japanese Patent Application Kokai Publication No. 2008-227815

SUMMARY OF INVENTION

Technical Problem

However, in the device disclosed in Patent Literature 1, one of the document glass or sensor-mounted board is fastened to a high-precision member, however, the other is fastened to a resin member, which is a separate part. Therefore, the relative position of the document glass and the sensor-mounted board is affected by differences in the dimensions of the high-precision member and the resin member, and as a result, there is a problem in that the precision of the relative positions of the rod lens, document glass and sensor-mounted board is low.

In the case of the contact-type image sensor disclosed in Patent Literature 2, in addition to the frame, a separate holder for preventing light rays that are irradiated by the LED chip from directly entering into the light-receiving sensor, and that holds the rod lens array is necessary, and as a result, there is a problem in that construction is complicated. As the construction becomes complicated, it becomes difficult to form a housing having high precision.

The contact image sensor that is disclosed in Patent Literature 3 has heat-dissipating plates and plate springs for securing the heat-dissipating plates, so construction is complicated. When the construction is complicated, it becomes difficult to form a housing having high precision.

The object of the present disclosure is to obtain an image sensor that eliminates the problems described above, and that has a housing having a highly precise shape.

Solution to Problem

The image sensor of this disclosure comprises a light guide that extends in a main scanning direction and that emits light onto an irradiated body; a lens that focuses reflected light that has been reflected by the irradiated body; a light receiver that receives the reflected light that was focused by the lens; and a housing. The housing houses or holds the light guide, the lens, and the light receiver, and comprises a metal portion and a resin portion that are formed into one housing.

Advantageous Effects of Invention

With this disclosure, the housing is formed by integrating a metal portion and a resin portion, so an image sensor is obtained that uses a housing that has good heat dissipation, suppresses distortion and has a highly precise shape.

DESCRIPTION OF EMBODIMENTS

First Embodiment.

Figure 1:
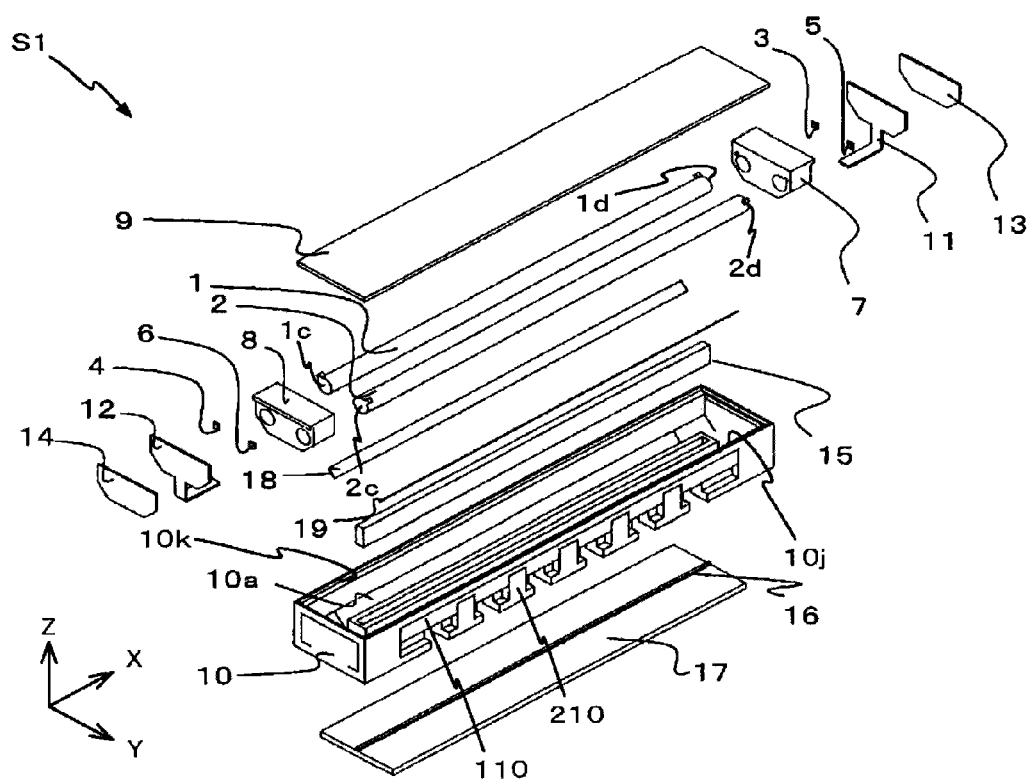
FIG. 1 is an exploded view of an image sensor of a first embodiment of the present disclosure.
Figure 2:
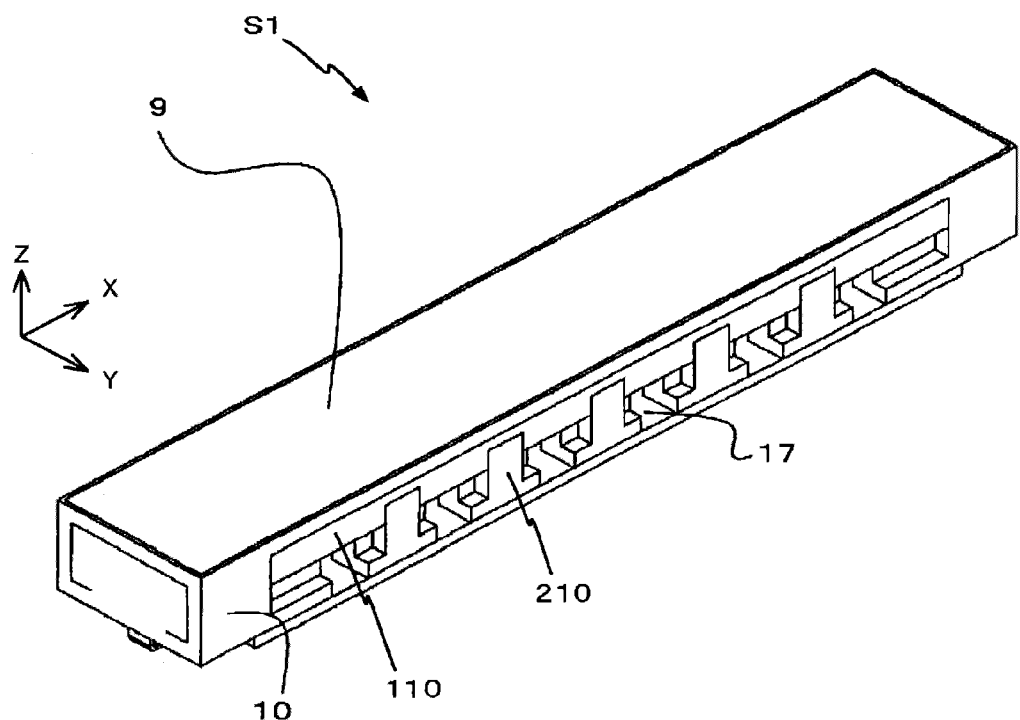
FIG. 2 is a perspective view of the image sensor of the first embodiment of the present disclosure.
Figure 3:
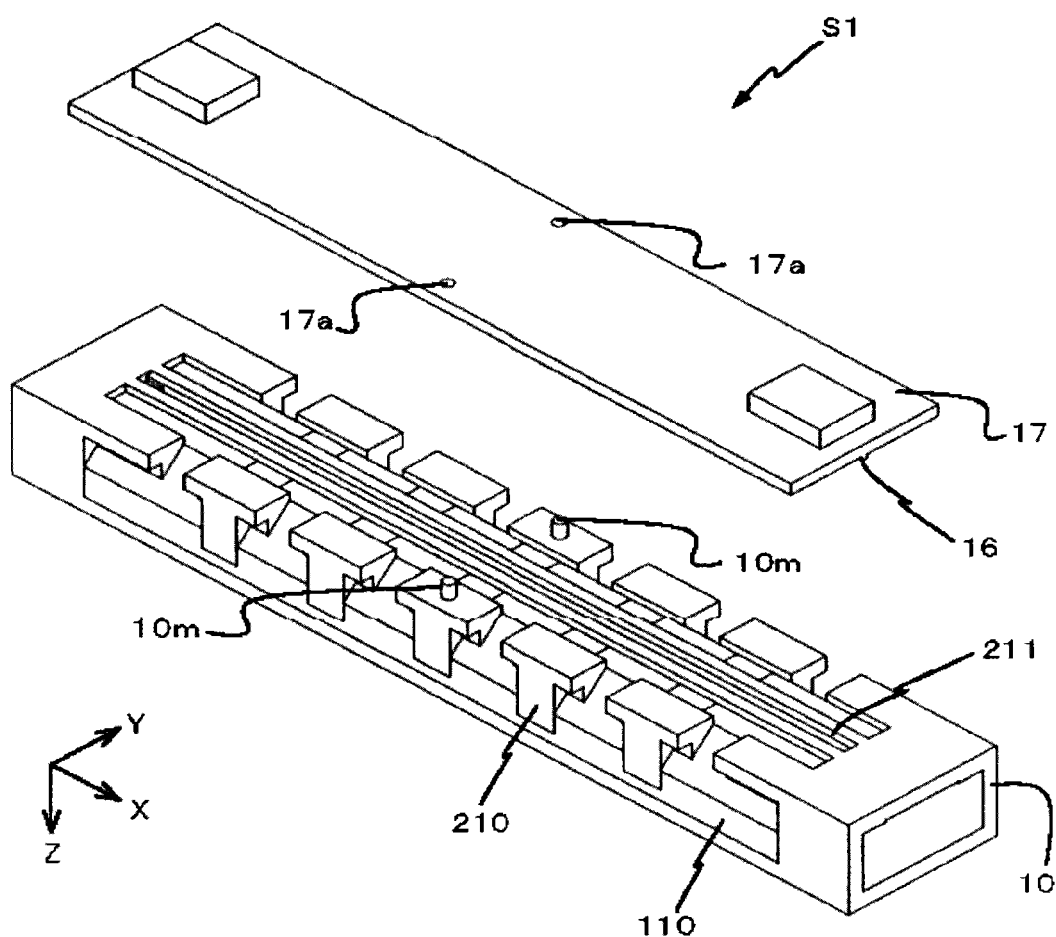
FIG. 3 is a constructional view of the image sensor of the first embodiment of the present disclosure as seen from the installed side of a sensor board.
Figure 4A:
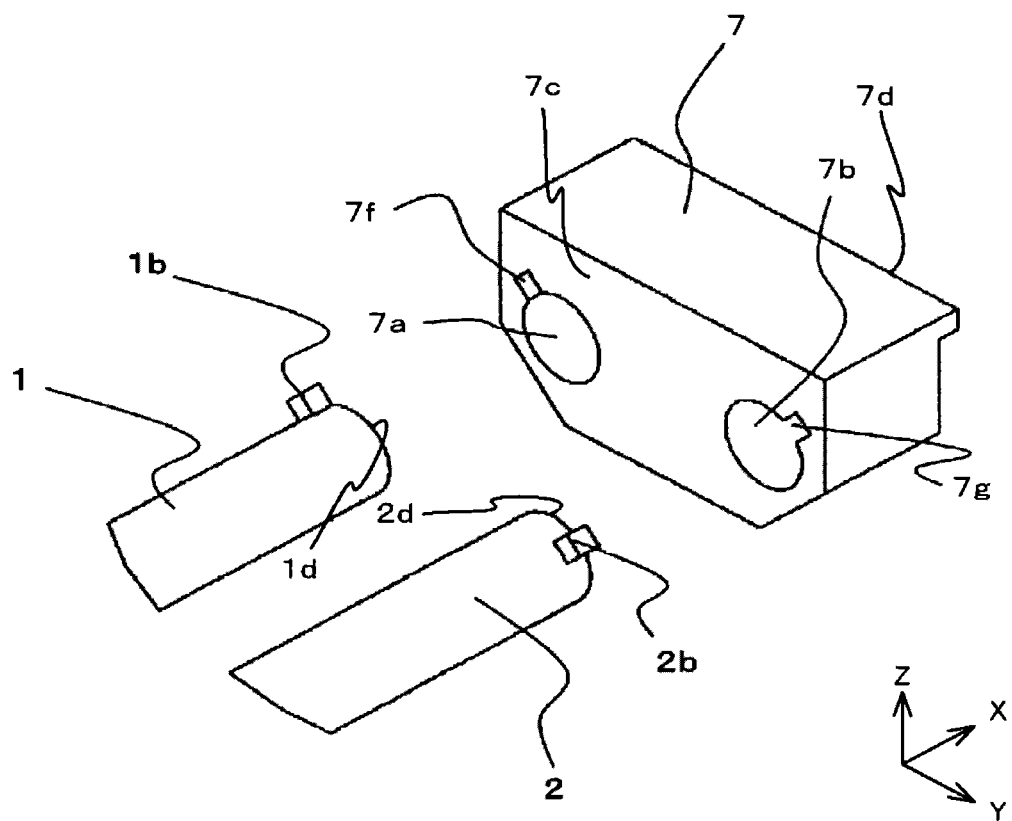
FIG. 4A is an exploded view of light guides and holder of the image sensor (lighting device) of the first embodiment of the present disclosure (1/2)
Figure 4B:
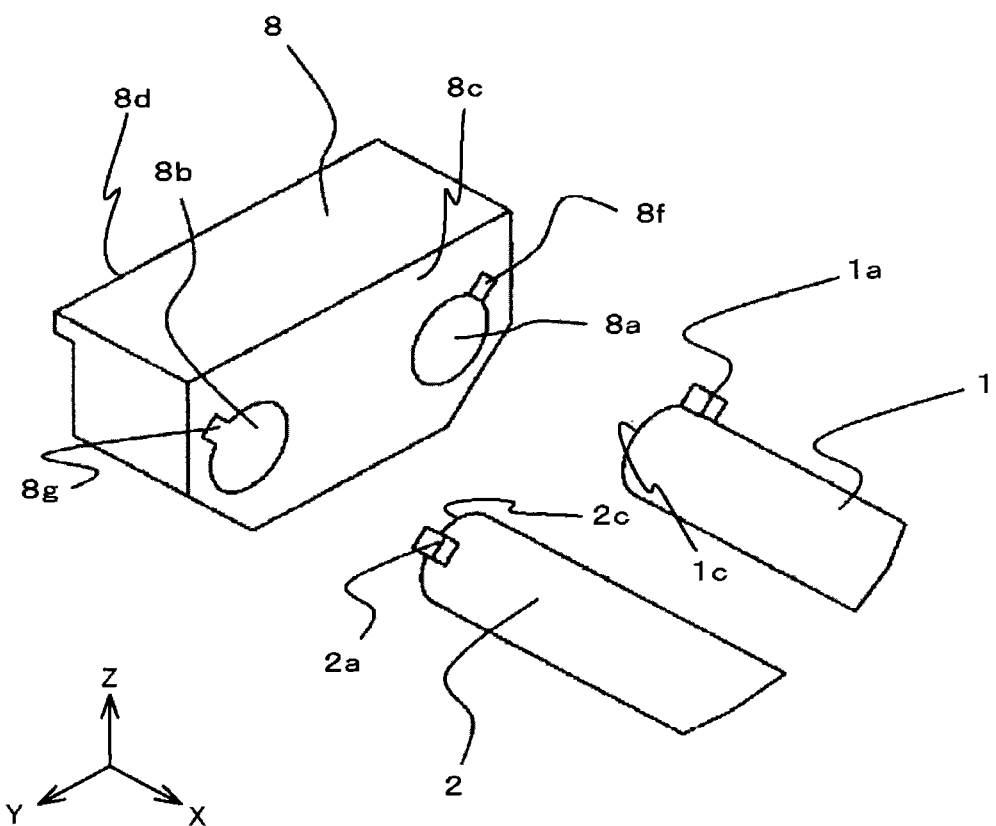
FIG. 4B is an exploded view of light guides and holder of the image sensor (lighting device) of the first embodiment of the present disclosure (2/2)
Figure 5A:
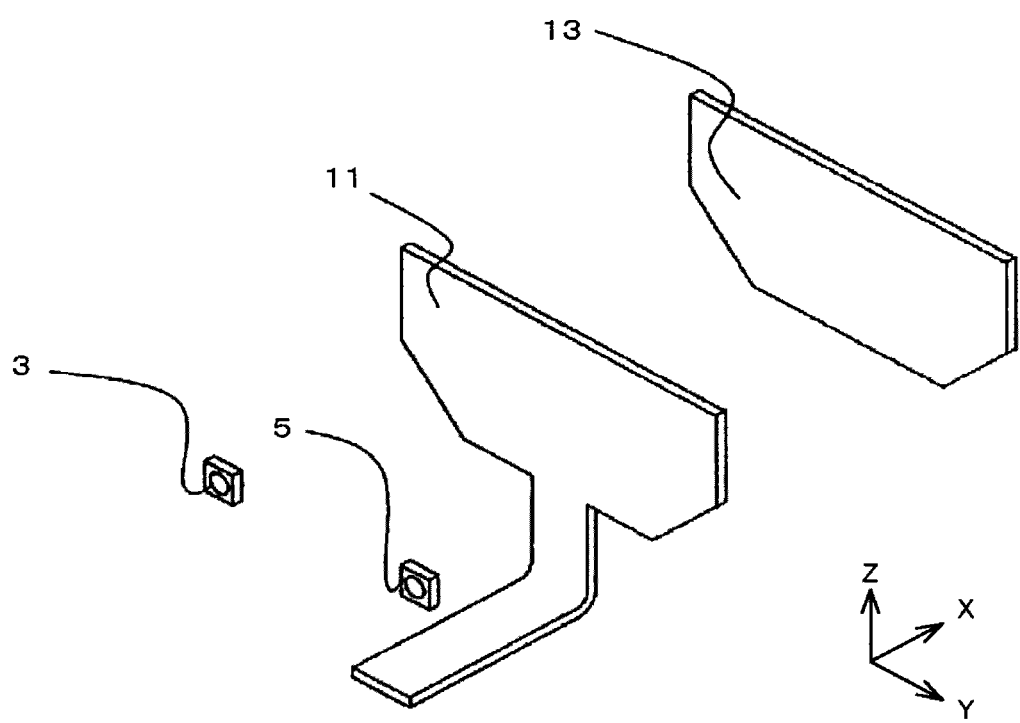
FIG. 5A is an exploded view of light sources, light-source board and heat-transfer body of the image sensor of the first embodiment of the present disclosure (1/2)
Figure 5B:
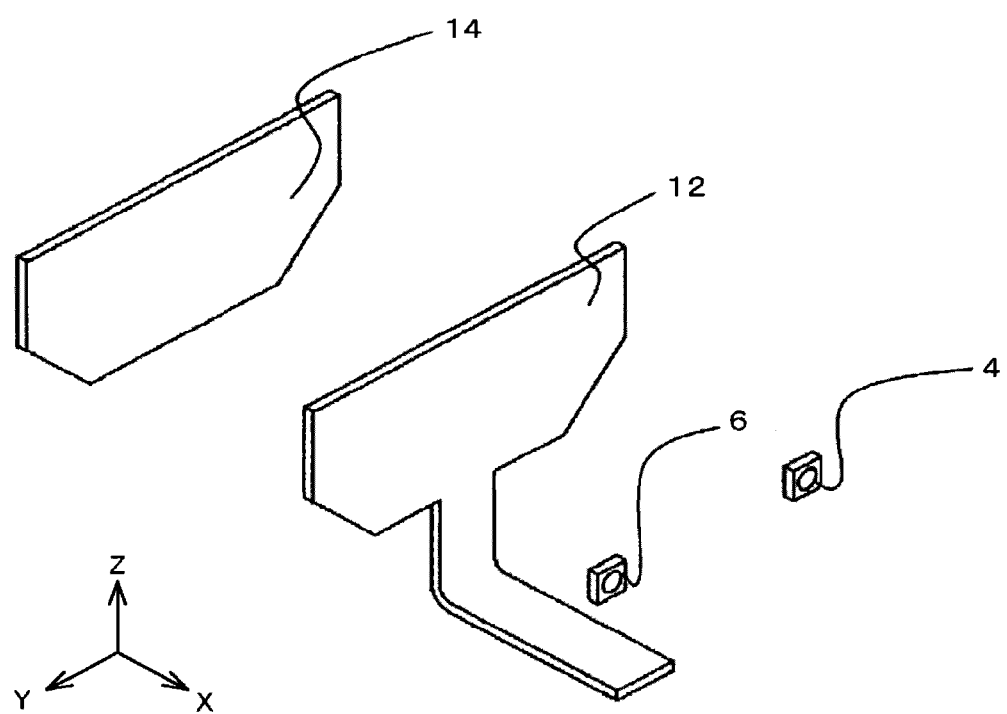
FIG. 5B is an exploded view of light sources, light-source board and heat-transfer body of the image sensor of the first embodiment of the present disclosure (2/2)
Figure 6:
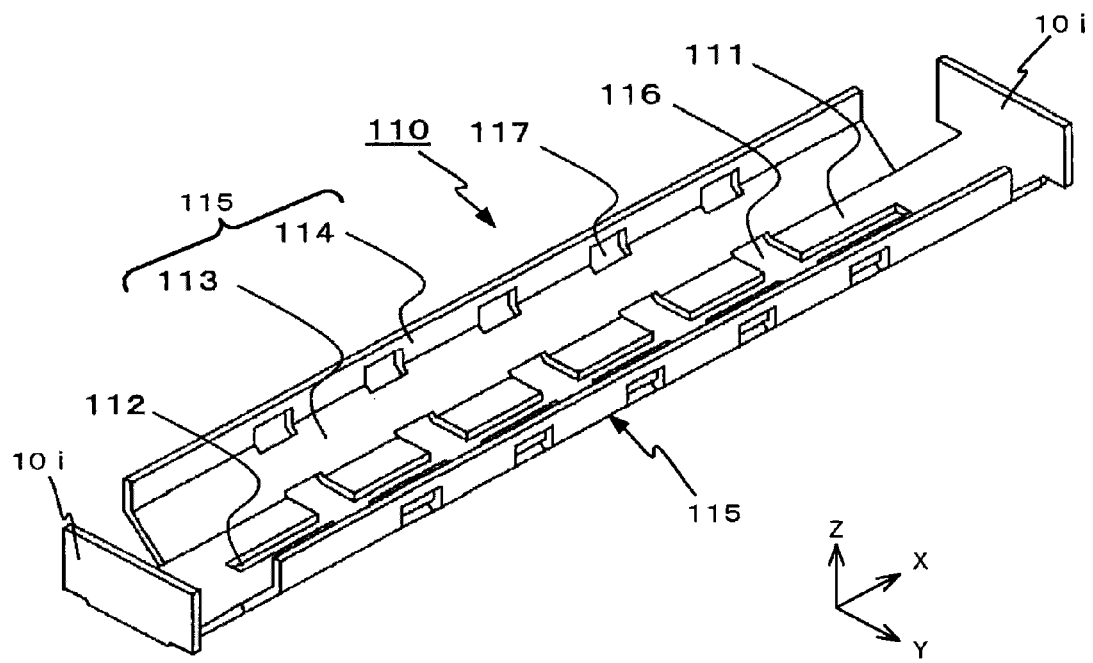
FIG. 6 is an external view of a housing metal portion for the image sensor of the first embodiment of the present disclosure.
Figure 7:
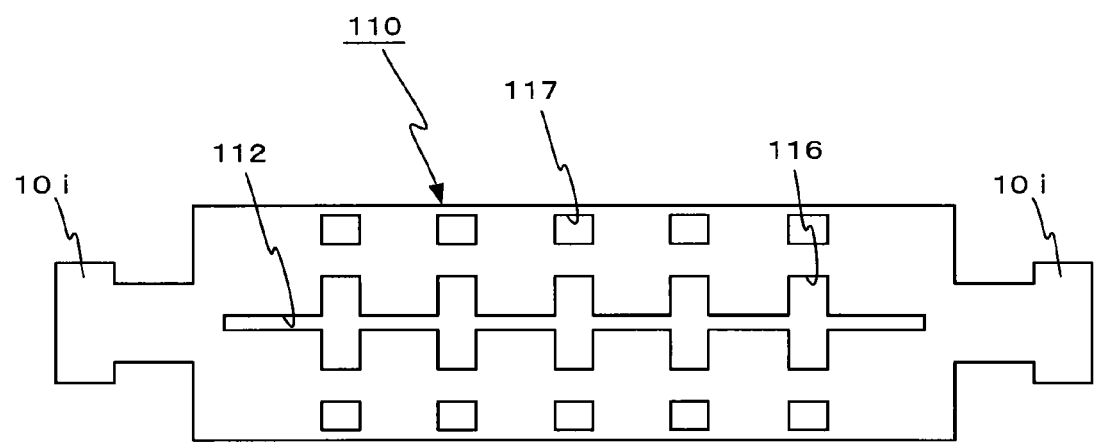
FIG. 7 is an expanded view of the housing metal portion for the image sensor of the first embodiment of the present disclosure.
Figure 8:
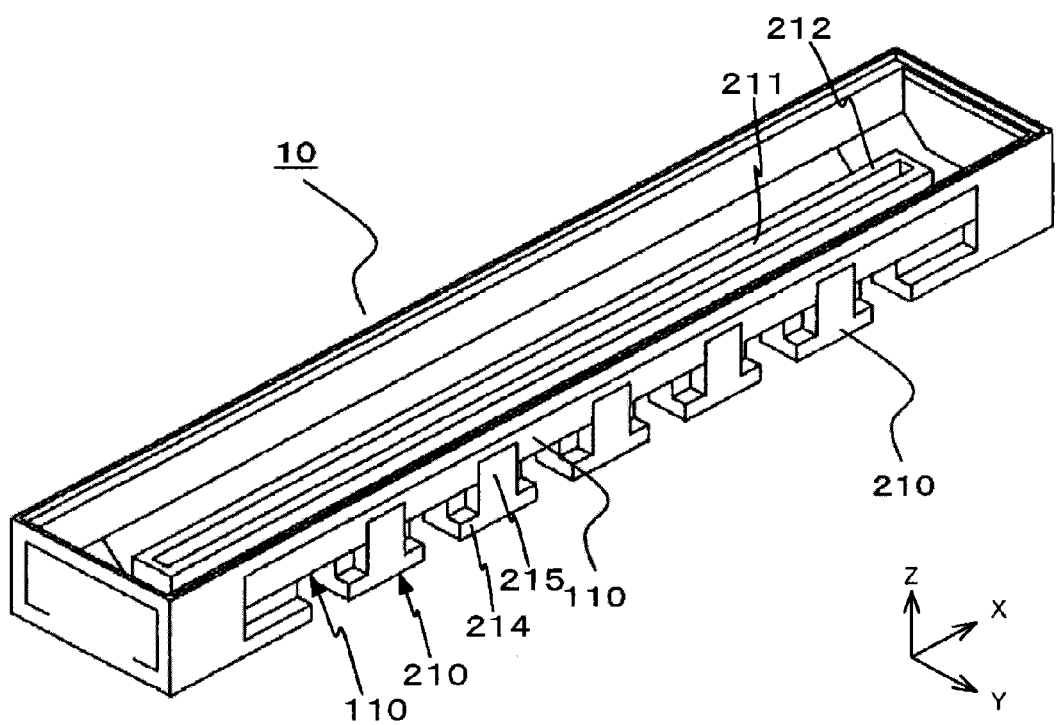
FIG. 8 is a view of a housing for the image sensor of the first embodiment of the present disclosure as seen from the irradiated side.
Figure 9:
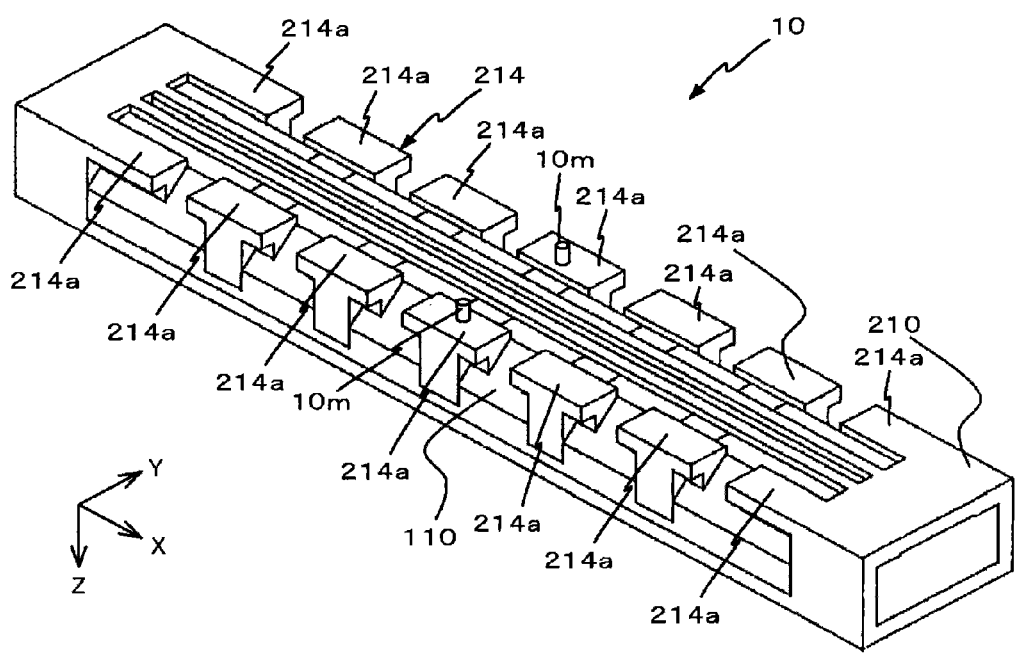
FIG. 9 is a view of the housing for the image sensor of the first embodiment of the present disclosure as seen from the rear surface.
Figure 10:
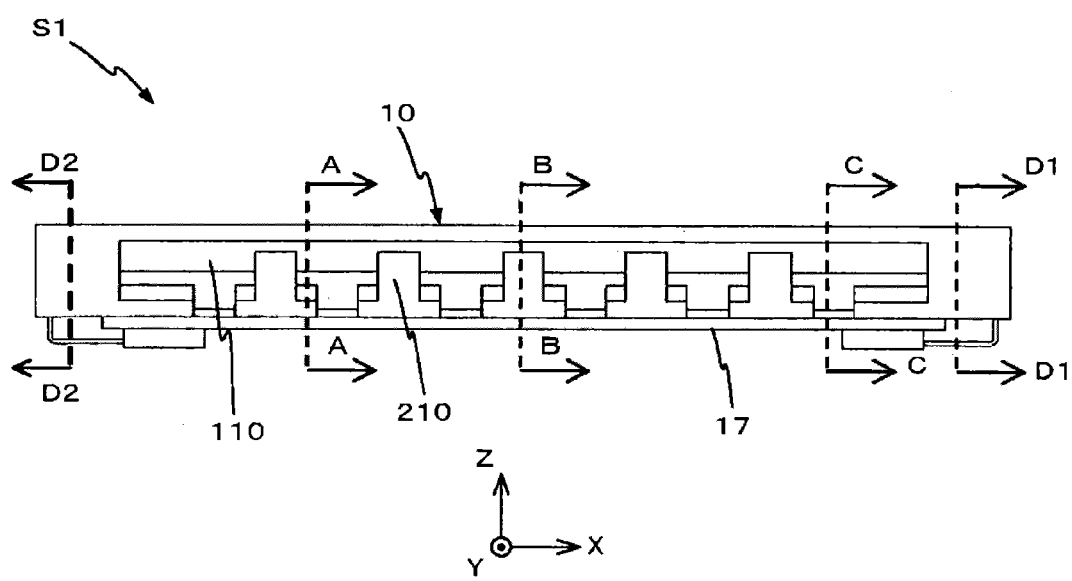
FIG. 10 is a side view of the image sensor of the first embodiment of the present disclosure.
Figure 11:
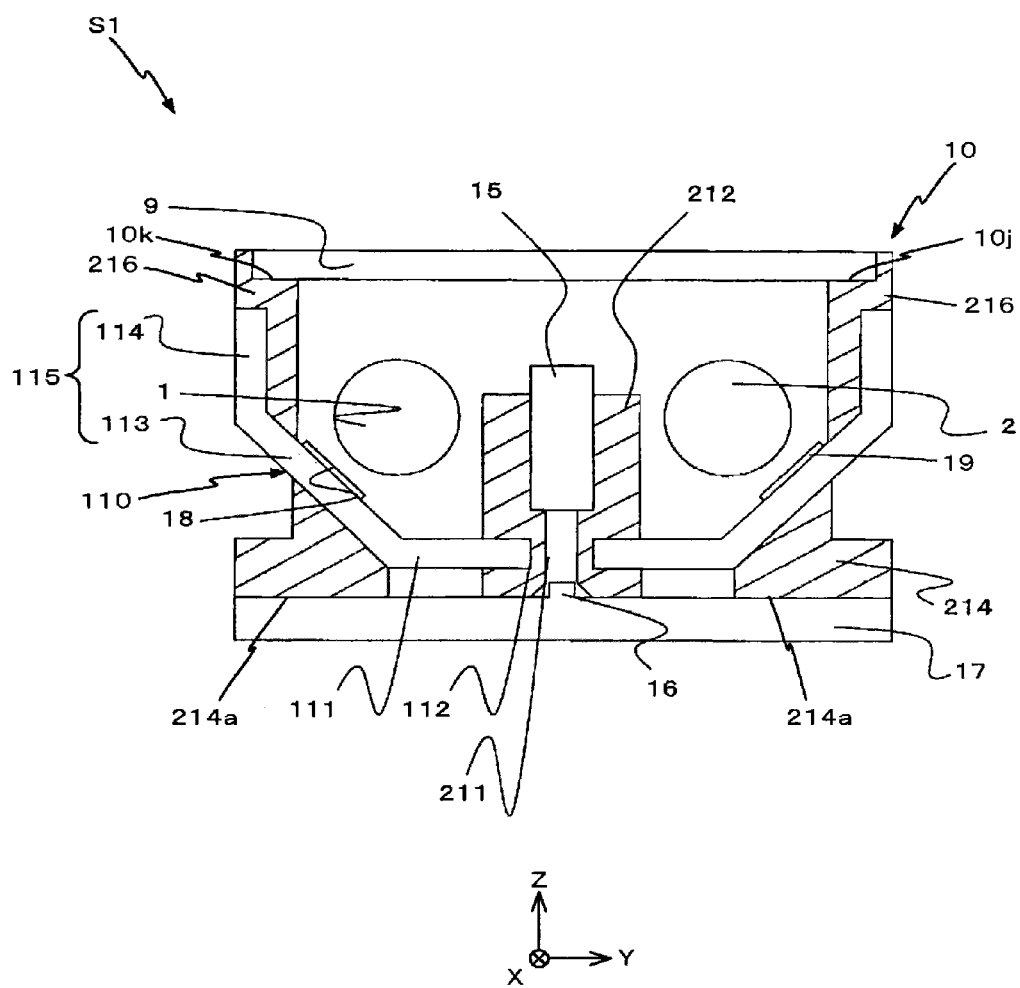
FIG. 11 is a cross-sectional view of line A-A in FIG. 10.
Figure 12:
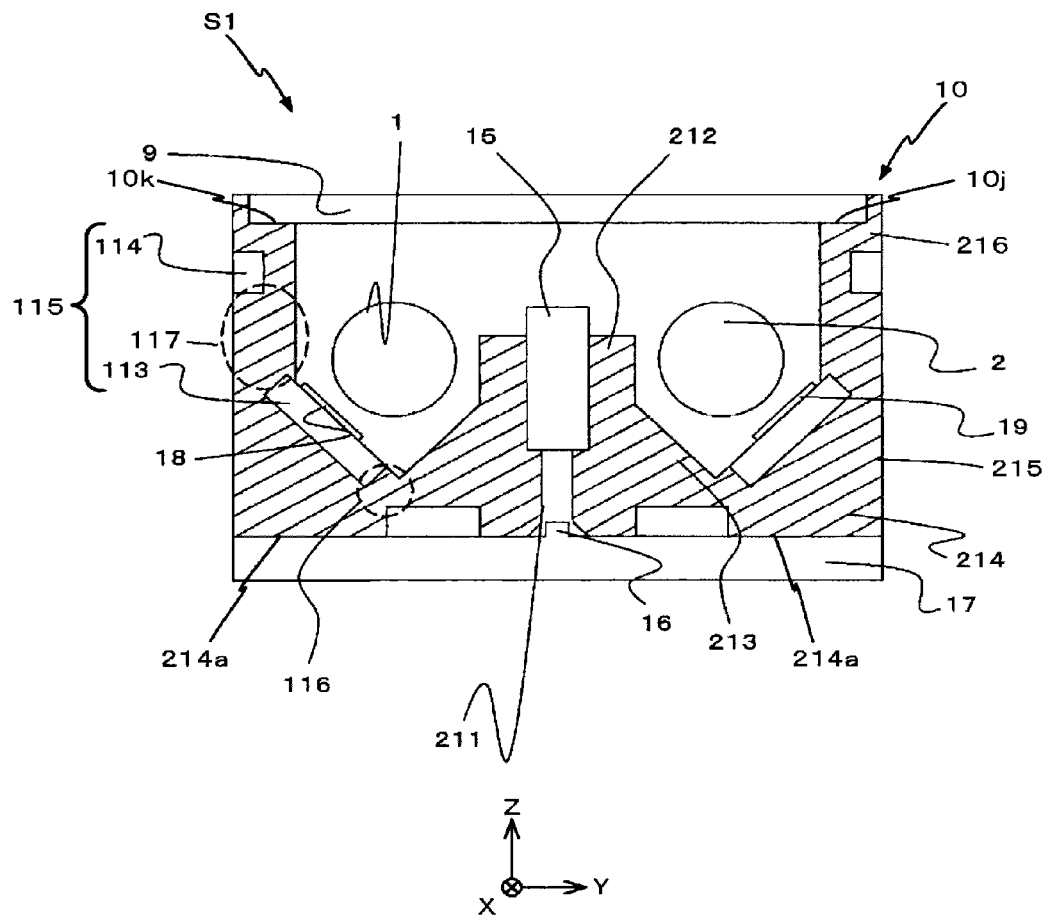
FIG. 12 is a cross-sectional view of line B-B in FIG. 10.
Figure 13:
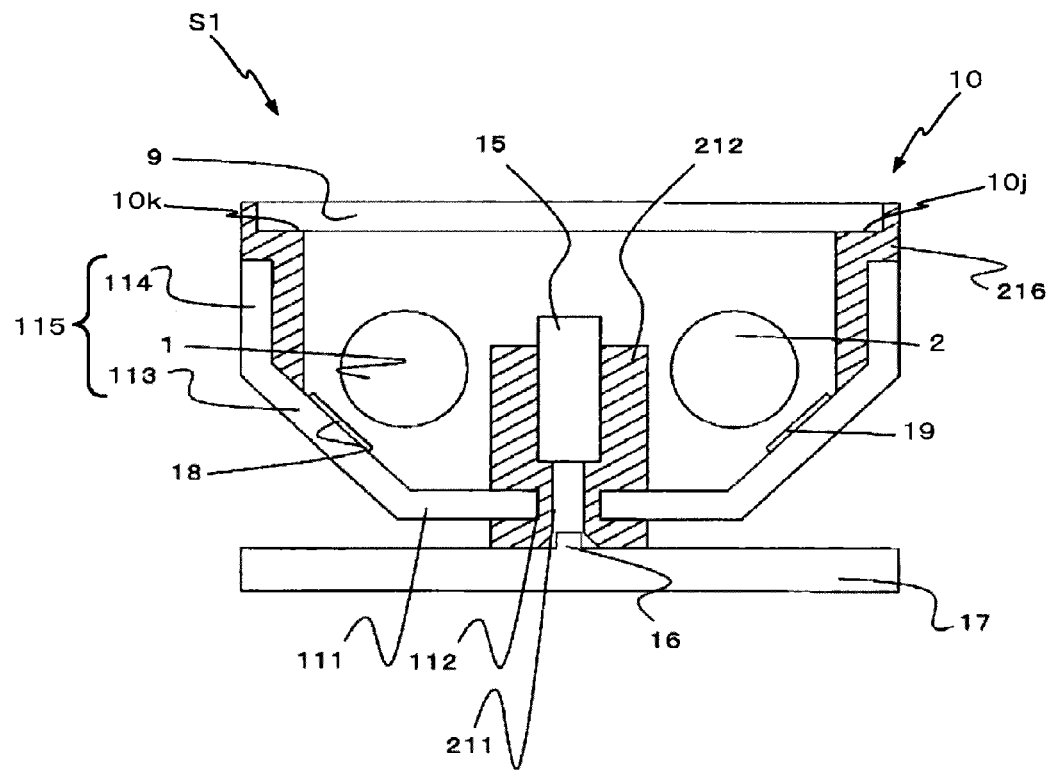
FIG. 13 is a cross-sectional view of line C-C in FIG. 10.
Figure 14A:
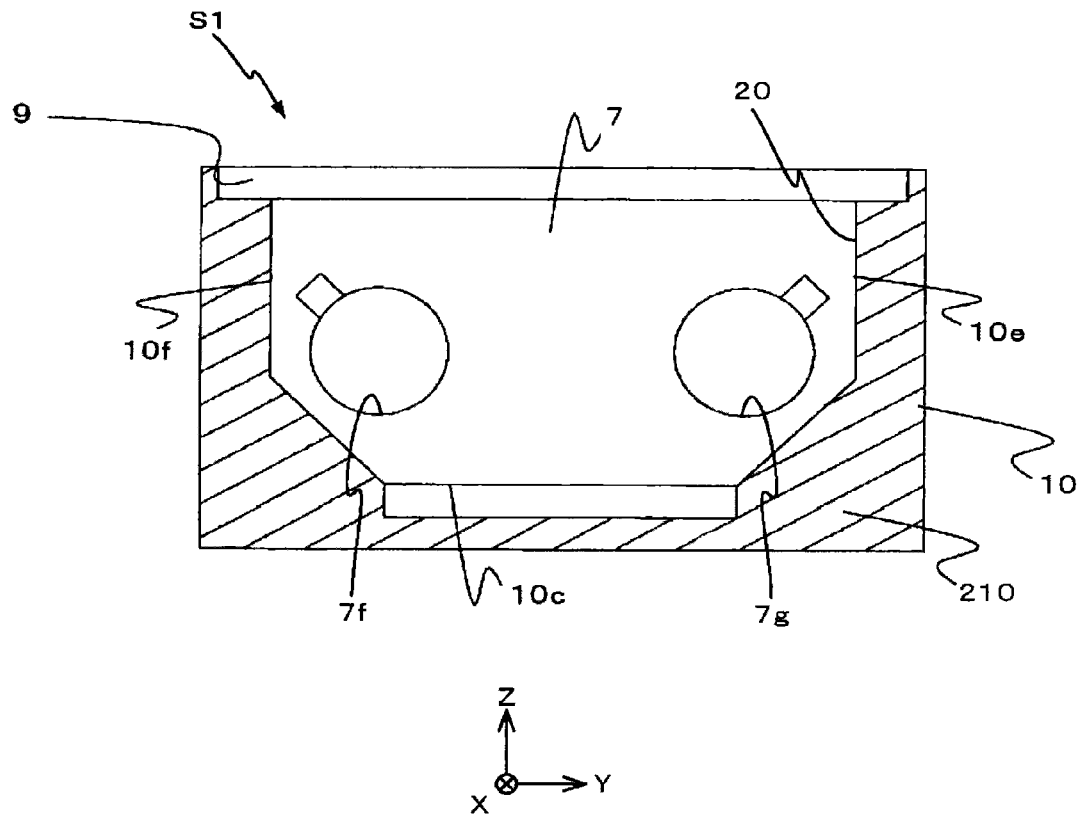
FIG. 14A is a cross-sectional view of line D1-D1 in FIG. 10.
Figure 14B:
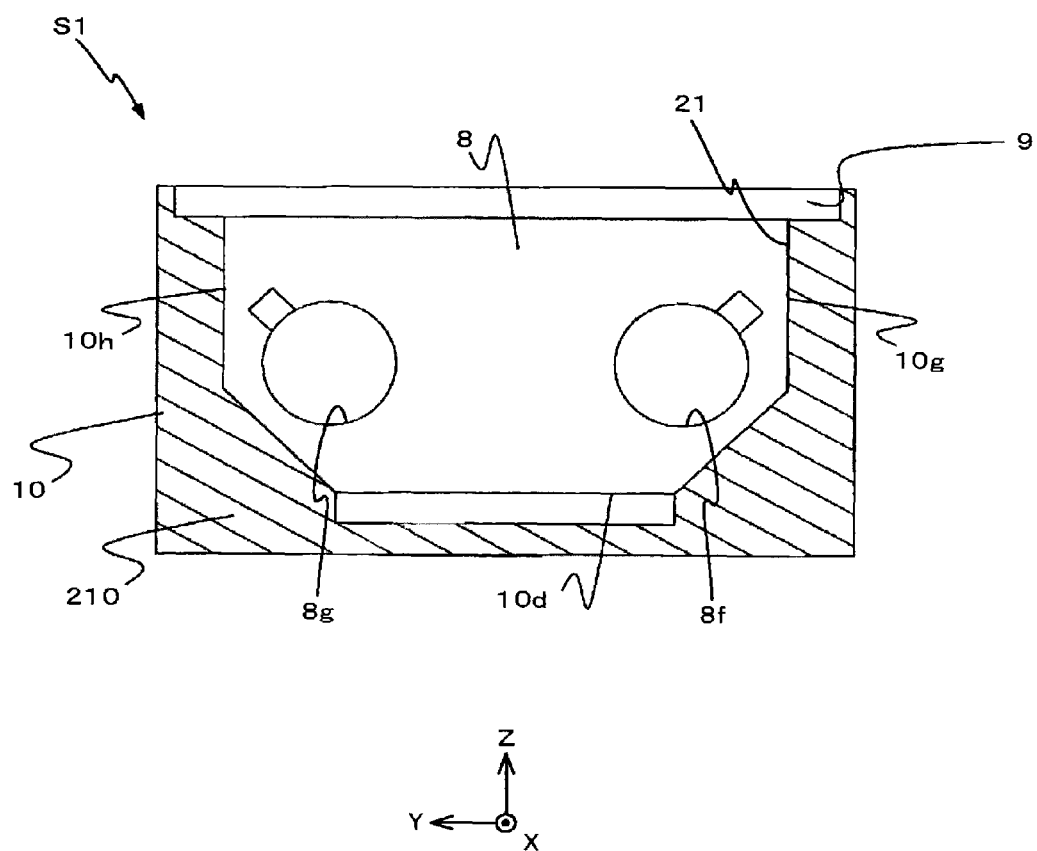
FIG. 14B is a cross-sectional view of line D2-D2 in FIG. 10.
Figure 15A:
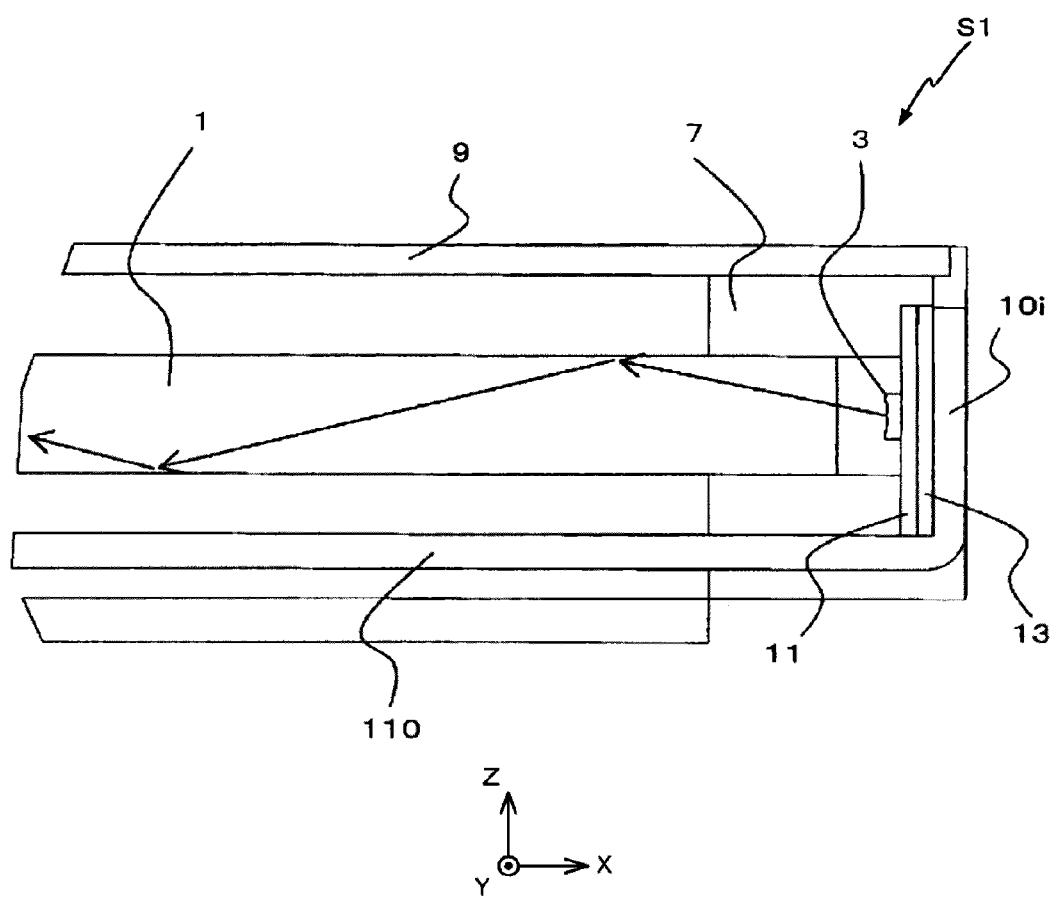
FIG. 15A is a cross-sectional view of the main scanning direction of the holder of the image sensor of the first embodiment of the present disclosure (1/2)
Figure 15B:
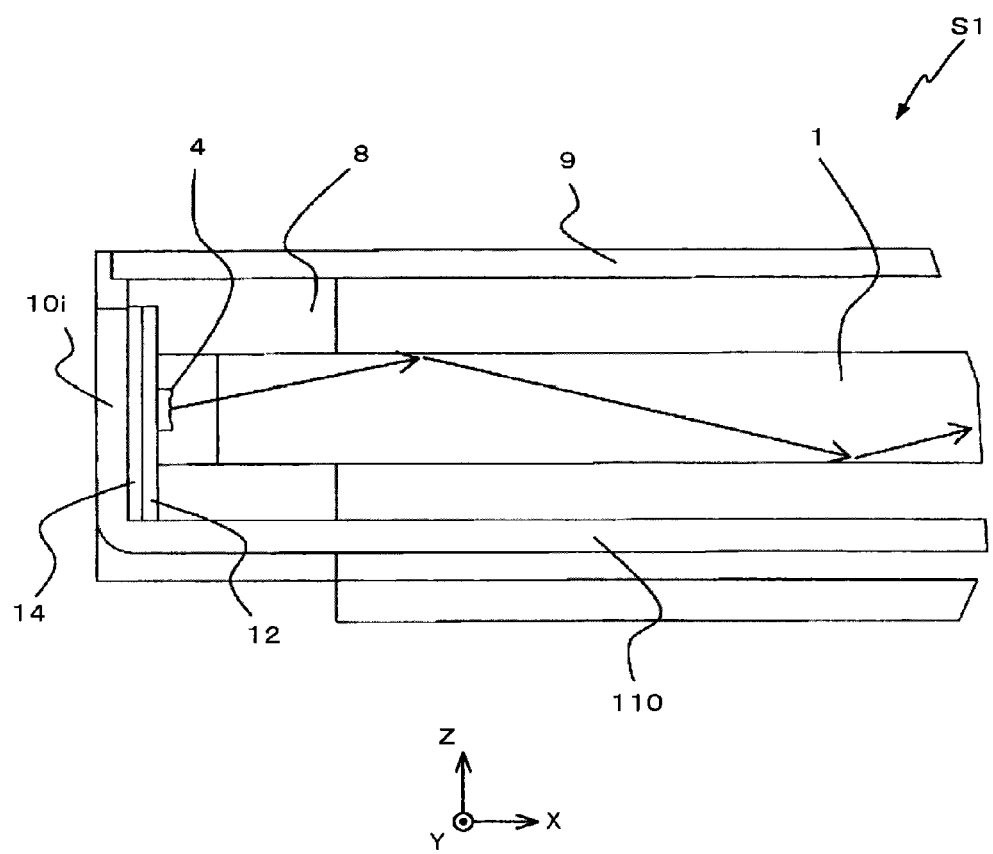
FIG. 15B is a cross-sectional view of the main scanning direction of the holder of the image sensor of the first embodiment of the present disclosure (2/2)

In the following, an image sensor S1 of a first embodiment of the present disclosure will be explained using FIG. 1 to FIG. 15B. FIG. 1 is an exploded view of the image sensor S1 of this first embodiment of the present disclosure. FIG. 2 is a perspective view of the image sensor S1. FIG. 3 is a constructional view of the image sensor Si as seen from the installed side of the sensor board 17. FIG. 4A is an exploded view of light guides 1, 2 and holder 7 of the image sensor S1. FIG. 4B is an exploded view of light guides 1, 2 and holder 8 of the image sensor S1. FIG. 5A is an exploded view of light sources 3, 5, light-source board 11 and heat-transfer body 13 of the image sensor S1. FIG. 5B is an exploded view of light sources 4, 6, light-source board 12 and heat-transfer body 14 of the image sensor S1. FIG. 6 is an external view of the housing metal portion 110 for the image sensor S1. FIG. 7 is an expanded view of the housing metal portion 110 for the image sensor S1. FIG. 8 is a view of the housing 10 for the image sensor S1 as seen from the irradiated side. FIG. 9 is a view of the housing 10 for the image sensor S1 as seen from the rear surface. FIG. 10 is a side view of the image sensor S1. FIG. 11 is a cross-sectional view of line A-A in FIG. 10. FIG. 12 is a cross-sectional view of line B-B in FIG. 10. FIG. 13 is a cross-sectional view of line C-C in FIG. 10. FIG. 14A is a cross-sectional view of line D1-D1 in FIG. 10. FIG. 14B is a cross-sectional view of line D2-D2 in FIG. 10. FIG. 15A is a cross-sectional view of the main scanning direction of the holder 7 of the image sensor S1 (1/2). FIG. 15B is a cross-sectional view of the main scanning direction of the holder 8 of the image sensor S1 (2/2).

In order to facilitate understanding, XYZ coordinates are set and appropriately referenced. In the drawings, the X-axis direction is the main scanning direction of the image sensor S1 (lengthwise direction of the image sensor S1). The Y-axis direction is the sub-scanning direction of the image sensor S1 (conveyance direction of the object being read and conveyed, short direction of the image sensor S1). The Z-axis direction is the focal depth direction of the image sensor S1 (thickness direction of the image sensor S1). When the image sensor S1 is a contact image sensor, the Z-axis direction is the optical axis direction of the rod lens array. The X axis, Y axis and Z axis are orthogonal to each other.

In the first embodiment of the present disclosure, the reading width direction of the image sensor S1 indicates the reading width (length of document being read) of only the main scanning direction of the image sensor S1.

As illustrated in FIG. 1, the image sensor S1 comprises: two light guides 1, 2 for irradiating the document; light sources 3, 4, 5, 6 that provide light for irradiating the light guides 1, 2; holders 7, 8 that hold the light guides 1, 2; a transparent-plate 9; a housing 10; light-source boards 11, 12; heat-transfer bodies 13, 14; a sensor 16; a sensor board 17; and reflecting plates 18, 19.

The light guide 1 is formed using a transparent resin. The light guide 1 extends in the X-axis direction (main scanning direction). The light guide 1 is formed into a cylindrical shape with the X-axis direction being the lengthwise direction. The light guide 1 makes up the light emitter of a lighting device. The light guide 1 irradiates the document by guiding the light that is emitted by the light sources 3 and 4 in the X-axis direction and gradually releasing that light.

The light guide 2 is arranged nearly parallel with the light guide 1. The light guide 2 is formed using a transparent resin. The light guide 2 is formed into a cylindrical shape with the X-axis direction (main scanning direction) being the lengthwise direction. The light guide 2 irradiates the document by guiding the light that is emitted by the light sources 5 and 6 in the X-axis direction and gradually releasing that light. The light guide 2 makes up the light emitter of a lighting device.

In the first embodiment, the light guides 1, 2 are formed into a cylindrical shape with the X-axis direction being the lengthwise direction. However, the embodiment is not limited to this. The light guides 1, 2 could also be formed into a shape other than a cylindrical shape.

The light source 3 projects light onto one end surface (end surface on the +X side) in the main scanning direction of the light guide 1. The light source 3 comprises a light-source element such as an LED light source. The light source 4 is located on the other end surface (end surface on the −X side) in the main scanning direction of the light guide 1. The light source 4 comprises a light-source element such as an LED light source.

The light source 5 projects light onto one end surface (end surface on the +X side) in the main scanning direction of the light guide 2. The light source 5 comprises a light-source element such as an LED light source. The light source 6 is located on the other end surface (end surface on the −X side) in the scanning direction of the light guide 2. The light source 6 comprises a light-source element such as an LED light source.

The holders 7 and 8 support the light guides 1, 2 and light sources 3 to 6.

In FIG. 1, the end 1d on the +X side of the light guide 1, and the end 2d on the +X side of the light guide 2 are inserted into the holder 7. Moreover, the light source 3 is located in the holder 7 facing the end surface on the +X side of the light guide 1. The light source 5 is located in the holder 7 facing the end surface on the +X side of the light guide 2.

The end 1c on the −X side of the light guide 1, and the end 2c on the −X side of the light guide 2 are inserted into the holder 8. Moreover, the light source 4 is located in the holder 8 facing the end surface on the −X side of the light guide 1. The light source 6 is located in the holder 8 facing the end surface on the −X side of the light guide 2.

The transparent-plate 9 is formed using glass or a transparent resin. As illustrated in FIG. 1 and FIG. 2, the transparent-plate 9 is located blocking the opening of the housing 10 so as to cover the lighting device or image sensor S1. An object being read such as a document or paper money is conveyed over this transparent-plate 9.

The housing 10 is a frame that comprises an insert-molded body of metal and resin. The housing 10, as illustrated in FIG. 1, is such that stepped portions 10j, 10k that support the transparent-plate 9 are formed in the edge portion on the +Y and −Y sides of the opening of the housing 10. The stepped portions 10j, 10k are formed along the X-axis direction. In other words, the stepped sections of the stepped portions 10j, 10k are formed in a stepped shape in the Y direction (corresponds to the conveyance direction of the object being read).

When a transparent plate equivalent to transparent-plate 9 is already equipped in an image-reading device such as a copier or multi-function printer or the like in which the image sensor S1 is mounted, the transparent-plate 9 can be omitted. Furthermore, holes can be formed in the housing 10 for attaching the housing 10 to an image-reading device such as a copier or multi-function printer using screws, bolts or the like. For example, the holes that are formed in the housing 10 can be formed on the outside (+X side) of the holder 7 and the outside (−X side) of the holder 8, and in both end sections in the Y direction of the housing 10.

FIG. 3 is a constructional view of the image sensor S1 of the first embodiment of the present disclosure as seen from the installed side of the sensor board 17. Gates 10m are formed in the housing 10 at two locations. The gates 10m are formed so as to protrude in the −Z direction. Holes 17a are formed in the sensor board 17 at two locations. The holes 17a pass through the sensor board 17 in the Z-axis direction. The gates 10m are inserted into the holes 17a. As a result, the sensor board 17 is attached to the housing 10. In other words, the gates 10m function as positioning pins for the sensor board 17. In this way, the sensor 16 is easily and accurately attached to an opening 211 that is provided in the housing 10. It is not illustrated in the drawings, however the sensor board 17 is fastened to the housing 10 with screws or the like.

In FIG. 4A, the holder 7 has an insertion hole 7a through which the light guide 1 is respectively inserted, and an insertion hole 7b through which the light guide 2 is respectively inserted. The insertion holes 7a, 7b pass through in the X-axis direction. Notches 7f, 7g are respectively formed in the inner-circumferential surfaces of the insertion holes 7a, 7b. Protrusions 1b, 2b that protrude in the radial direction are formed on the ends 1d, 2d on the +X sides of the light guides 1, 2. The notches 7f, 7g are formed into a shape capable of fitting with the protrusions 1b, 2b. By fitting the protrusions 1b, 2b into the notches 7f, 7h, the light guides 1, 2 are fastened to the holder 7 so as not to rotate around their respective axes. In other words, the protrusions 1b, 2b function as fittings that fit in the notches 7f, 7g.

In FIG. 4B, the holder 8 has insertion holes 8a, 8b through which the light guides 1, 2 are respectively inserted. Notches 8f, 8g are respectively formed in the openings of the insertion holes 8a, 8b. Protrusions 1a, 2a that protrude in the radial direction are formed on the ends 1c, 2c on the -X sides of the light guides 1, 2. The notches 8f, 8g are formed into a shape capable of fitting with the protrusions 1a, 2a. By fitting the protrusions 1a, 2a into the notches 8f, 8h, the light guides 1, 2 are fastened to the holder 8 so as not to rotate around their respective axes. In other words, the protrusions 1a, 2a function as fittings.

As illustrated in FIG. 4A, in the first embodiment, by fitting the protrusions 1b, 2b in the notches 7f, 7g, the light guides 1, 2 are fastened to the holder 7 so as not to rotate around their respective axes. However, the construction for fastening the light guides 1, 2 to the holder 7 is not limited to this. For example, the insertion holes 7a, 7b can be formed in through holes that have a tapered shape in which the inner diameter gradually decreases in the +X direction. In that case, the light guides 1, 2 are fastened to the holder 7 by pressing the ends 1d, 2d of the light guides 1, 2 into the insertion holes 7a, 7b.

Similarly, as illustrated in FIG. 4B, in the first embodiment, by fitting the protrusions 1a, 2a in the notches 8f, 8g, the light guides 1, 2 are fastened to the holder 8 so as not to rotate around their respective axes. However, the construction for fastening the light guides 1, 2 to the holder 8 is not limited to this. For example, the insertion holes 8a, 8b can be formed in through holes that have a tapered shape in which the inner diameter gradually decreases in the −X direction. In that case, the light guides 1, 2 are fastened to the holder 8 by pressing the ends 1c, 2c of the light guides 1, 2 into the insertion holes 8a, 8b.

As illustrated in FIG. 4A, the insertion holes 7a, 7b should allow light to pass from the surface 7c to the surface 7d. In other words, as long as light from the light sources 3, 5 can propagate along the light guides 1, 2, the insertion holes 7a, 7b do not need to be penetrating holes. That is, there is no need for there to be empty space between the end surface of the light guide 1 and the light source 3. Similarly, there is no need for there to be empty space between the end surface of the light guide 2 and the light source 5. Moreover, a transparent material that allows light to propagate can be filled into the insertion holes 7a, 7b that are through holes.

As illustrated in FIG. 4B, the insertion holes 8a, 8b should allow light to pass from the surface 8c to the surface 8d. In other words, as long as light from the light sources 4, 6 can propagate along the light guides 1, 2, the insertion holes 8a, 8b do not need to be penetrating holes. That is, there is no need for there to be empty space between the end surface of the light guide 1 and the light source 4. Similarly, there is no need for there to be empty space between the end surface of the light guide 2 and the light source 6. Moreover, a transparent material that allows light to propagate can be filled into the insertion holes 8a, 8b that are through holes.

As illustrated in FIG. 1, the light sources 3, 4 are respectively located at the end sections 1d, 1c on both sides of the light guide 1. However, the embodiment is not limited to this, and a light source could be located at only one end section of the end sections 1d, 1c. Similarly, the light sources 5, 6 are respectively located at the end sections 2d, 2c on both sides of the light guide 2. However, the embodiment is not limited to this, and a light source could be located at only one end section of the end sections 2d, 2c.

In FIG. 5A, the light-source board 11 is a flexible board on which the light sources 3, 5 are mounted. The heat-transfer body 13 is arranged so as to come in contact with the surface opposite the surface where the light sources 3, 5 are mounted on the light-source board 11. By coming into contact with the light-source board 11, the heat-transfer body 13 transfers heat that is generated in the light-source board 11 to the housing metal portion 110.

In FIG. 5B, the light-source board 12 is a flexible board on which the light sources 4, 6 are mounted. The heat-transfer body 14 is arranged so as to come in contact with the surface opposite the surface where the light sources 4, 6 are mounted on the light-source board 12. By coming into contact with the light-source board 12, the heat-transfer body 14 transfers heat that is generated in the light-source board 12 to the housing metal portion 110.

In FIG. 1, the reflection plate 18 extends in the X-axis direction (main scanning direction) and reflects light from the light guide 1. The reflection plate 18 is fastened to a reflection-plate-installation surface 10a of the housing 10.

The reflection plate 19 extends in the X-axis direction and reflects light from the light guide 2. The reflection plate 19 is fastened to a reflection-plate-installation surface 10b (see FIG. 11) of the housing 10.

The housing 10 is an insert-molded body of which a metal portion that is formed by bending metal plate is insert molded with resin. FIG. 6 is a constructional view of the housing metal portion 110, and FIG. 7 is an expanded view of this housing metal portion 110. The housing metal portion 110 of the housing 10 is formed by bending one sheet of sheet metal.

FIG. 8 is a perspective view of the housing 10 as seen from the side on which the transparent-plate 9 is mounted, and FIG. 9 is a perspective view of the housing 10 as seen from the installation-surface side where the sensor board 17 is installed. The housing 10 comprises a housing metal portion 110 and a housing resin portion 210.

FIG. 11, FIG. 12 and FIG. 13 are cross-sectional views of line A-A, line B-B and line C-C in FIG. 10.

In FIG. 1, and FIG. 11 to FIG. 13, a lens 15 is an optical member or combination of optical members that focuses reflected light that is emitted from the light guides 1, 2 and reflected by the object being read. When the image sensor S1 is a reflected light source type of sensor, the optical member is, for example, a lens array such as a rod lens array or macro lens array that focuses light onto a line sensor (sensor array). The lens 15 that is a combination of optical members, for example, is a lens or mirror of an image sensor (image reading device) of an optical reduction system. The sensor 16 is a sensor array that comprises sensor ICs that receive light that passes through the lens 15.

In FIG. 1, FIG. 3 and FIG. 11 to FIG. 13, the sensor board 17 is a circuit board on which the sensor 16 that is a light-receiving element is mounted. The sensor board 17 has a connector (not illustrated in the figures) that is capable of connecting with external devices. Moreover, the sensor 16 receives light that was focused on the sensor 16 by the lens 15, and performs photoelectric conversion of that light. The length in the X-axis direction (main scanning direction) of the sensor 16 is a length that corresponds to the reading length of the image sensor S1. The connector outputs an electric signal that was obtained from the photoelectric conversion by the sensor 16 that is mounted on the sensor board 17 as an image signal to an external device of the sensor board 17. The sensor board 17 is fastened to the edge portion of the rear surface of the housing 10 by a fastening means such as screws.

In FIG. 1, and FIG. 11 to FIG. 13, the transparent-plate 9 is located between the light guides 1, 2 and the object being read. The transparent-plate 9 prevents foreign matter from getting inside the housing 10. The transparent-plate 9 is made using a transparent material in order to suppress attenuating light that is irradiated from the light guides 1, 2 (line light source) and the light reflected from the object being read.

FIG. 14A is a cross-sectional view of line D1-D1 in FIG. 10. In FIG. 14A, a holder fitting 20 for fitting the holder 7 inside is formed inside the housing 10. The holder fitting 20 is formed into a shape that corresponds to the shape of the holder 7. More specifically, the holder fitting 20 comprises positioning surfaces 10c, 10e, 10f. The bottom surface of the holder 7 that is fitted inside the holder fitting 20 comes in contact with the positioning surface 10c, which positions the holder 7 in the Z-axis direction. Moreover, the side surfaces on both sides of the holder 7 come in contact with the positioning surfaces 10e, 10f, which positions the holder 7 in the Y-axis direction.

FIG. 14B is a cross-sectional view of line D2-D2 in FIG. 10. In FIG. 14B, a holder fitting 21 for fitting the holder 8 inside is formed inside the housing 10. The holder fitting 21 is formed into a shape that corresponds to the shape of the holder 8. More specifically, the holder fitting 21 comprises positioning surfaces 10d, 10g, 10h. The bottom surface of the holder 8 that is fitted inside the holder fitting 21 comes in contact with the positioning surface 10d, which positions the holder 8 in the Z-axis direction. Moreover, the side surfaces on both sides of the holder 8 come in contact with the positioning surfaces 10g, 10h, which positions the holder 8 in the Y-axis direction.

By fitting the holders 7, 8 inside the holder fittings 20, 21 that are formed in the housing 10, it is possible to align the center in the Y direction of the holders 7, 8 (in other words, the center of lighting) with the optical axis.

FIG. 15A is a cross-sectional view in the main scanning direction of the holder 7 of the image sensor S1. In FIG. 15A, the heat-transfer body 13 is arranged so as to come in contact with a heat-transfer-body-contact surface 10i of the housing metal portion 110. Heat that is generated by the light source 3 is transferred to the housing metal portion 110 by way of the heat-transfer-body-contact surface 10i. As a result, it is possible to improve the heat dissipation of the image sensor S1. Similarly, as can be seen by referencing FIG. 15A and FIG. 5A, heat that is generated by the heat source 5 is also transferred to the housing metal portion 110 by way of the heat-transfer-body-contact surface 10i. As a result, it is possible to improve the heat dissipation of the image sensor S1.

FIG. 15B is a cross-sectional view in the main scanning direction of the holder 8 of the image sensor S1. In FIG. 15B, the heat-transfer body 14 is arranged so as to come in contact with a heat-transfer-body-contact surface 10i of the housing metal portion 110. Heat that is generated by the light source 4 is transferred to the housing metal portion 110 by way of the heat-transfer-body-contact surface 10i. As a result, it is possible to improve the heat dissipation of the image sensor S1. Similarly, as can be seen by referencing FIG. 15B and FIG. 5B, heat that is generated by the heat source 6 is also transferred to the housing metal portion 110 by way of the heat-transfer-body-contact surface 10i. As a result, it is possible to improve the heat dissipation of the image sensor S1.

In FIG. 8, FIG. 9 and FIG. 11 to FIG. 13, the housing 10 comprises a housing metal portion 110 and a housing resin portion 210.

The housing metal portion 110, as illustrated in FIG. 6 and FIG. 7, comprises a first bottom section 111, and a pair of sidewall sections 115 that are formed on both sides (+Y side and −Y side) of the first bottom section 111.

A slit section 112 and first hole sections 116 are formed in the first bottom section 111. The slit section 112 is formed in order for reflected light that passed through the lens 15 to pass through. The slit section 112 is formed to have a specified opening width in the Y-axis direction (sub scanning direction). The slit section 112 extends in the X-axis direction (main scanning direction). The first hole sections 116 are through holes that pass through in the Z-axis direction. The first hole sections 116 are formed so as to be orthogonal to the slit section 112. There are five first hole sections 116 that are formed. The first hole sections 116 are intermittently formed at uniform intervals in the X-axis direction. As illustrated in FIG. 12, the first hole sections 116 are formed at positions that correspond to reinforcing sections 213.

As illustrated in FIG. 8, FIG. 9 and FIG. 11 to FIG. 13, the sidewall section 115 comprises a first sidewall 113 and a second sidewall 114. The first sidewall 113 is bent inward from the first bottom section 111 so as to incline at a specified angle. The first sidewall 113 extends in the X-axis direction (main scanning direction). Moreover, the first sidewall 113 is formed such that the cross section is a circular arc shape. The second sidewall 114 is bent inward with respect to the first sidewall 113. The second sidewall 114 is orthogonal to the first bottom section 111. The second sidewall 114 extends in the X-axis direction (main scanning direction). As illustrated in FIG. 6 and FIG. 7, second hole sections 117 are formed in the sidewall section 115. There are five second hole sections 117 formed on both wall sections 115 on the +Y side and −Y side. The second hole sections 117, as illustrated in FIG. 12 are formed at positions that correspond to holders 215.

As illustrated in FIG. 8, FIG. 9 and FIG. 11 to FIG. 13, the housing resin portion 210 comprises a lens holder 212, reinforcing sections 213 that are formed on both sides (+Y side and −Y side) of the lens holder 212, a second bottom section 214, holders 215, and transparent-plate holders 216.

The lens holder 212 comes in close contact with the slit section 112 of the housing metal portion 110. The lens holder 212 has an opening 211 having a width that is a little narrower than the width of the opening in the Y-axis direction (sub scanning direction) of the slit section 112. As illustrated in FIG. 8, the lens holder 212 extends in the X-axis direction (main scanning direction). As illustrated in FIG. 11 to FIG. 13, the lens 15 is fitted inside the opening 211 of the lens holder 212.

The reinforcing sections 213, as illustrated in FIG. 12, reinforce the lens holder 212. The reinforcing sections 213 are integrally formed with the lens holder 212. The reinforcing sections 213 are formed so as to protrude upward from the first hole sections 116. In the first embodiment, plural reinforcing sections 213 are formed. The reinforcing sections 213 are provided so as to be separated at uniform intervals along the X-axis direction (main scanning direction).

The second bottom section 214, as illustrated in FIG. 11 to FIG. 13, is integrally formed with the reinforcing sections 213 by way of the first hole sections 116. The second bottom section 214, as illustrated in FIG. 9, has plural sensor-board holders 214a. The sensor-board holders 214a are provided so as to be separated at uniform intervals along the X-axis direction (main scanning direction).

As illustrated in FIG. 12, the holders 215 are integrally formed with the second bottom section 214. The holders 215 are formed between the second bottom section 214 and the first sidewall 113. The holders 215 are provided at positions that face the reinforcing sections 213. The holders 215 hold the second bottom section 214.

The transparent-plate holders 216, as illustrated in FIG. 11 to FIG. 13 are continuously formed from all of the holders 215 by way of the second hole sections 117. The transparent-plate holders 216 come in close contact with the inside and end sections of the second sidewall 114. The transparent-plate holders 216 extend in the main scanning direction. The transparent-plate 9 is placed on the housing edge on the top ends of the transparent-plate holders 216. More specifically, the transparent-plate 9 is fitted in the stepped portions 10j, 10k of the housing 10.

The relationship between the housing metal portion 110 and housing resin portion 210 of the housing 10 will be explained using FIG. 11 to FIG. 13. As illustrated in FIG. 11, in cross section of line A-A of the housing 10, the housing resin portion 210 is divided into three components; the transparent-plate holders 216, the second bottom section 214, and the lens holder 212. The transparent-plate holders 216 can adjust the position of the transparent-plate 9 that determines the focal position in order to hold the transparent-plate 9. The lens holder 212 holds the lens 15, so can adjust the position of the lens 15. Therefore, by adjusting the position of the transparent-plate 9, the position of the sensor 16, and the position of the lens 15 by the components at each of three locations, that is, the transparent-plate holders 216, the sensor-board holders 214a and the lens holder 212, it becomes possible to easily adjust the focal position. During insert molding of the housing 10, each of these three components are caused to curve in the concave direction with respect to the surface that comes in contact with the housing metal portion 110. Therefore, by adjusting the surface area of contact between each of these three components and the housing metal portion 110, it is possible to adjust the amount of deformation in the X and Z directions of the housing 10, and it is possible to suppress curving in the main scanning direction of the housing 10.

Moreover, it is possible to adjust the position of the transparent-plate 9, the position of the sensor 16 and the position of the lens 15 by each component at three locations, or in other words, the transparent-plate holders 216, the sensor-board holders 214a, and the lens holder 212. Therefore, it is possible to improve the precision of the relative positions of the object being read that is placed on the transparent-plate 9, the sensor 16 and the lens 15.

In cross section of line A-A of the housing 10, the housing resin portion 210 is divided into three portions, however, as illustrated in FIG. 12, in the cross section of line B-B of the housing 10, the housing resin portion 210 is integrated into one in the YZ plane. In other words, the lens holder 212, the reinforcing sections 213, the second bottom section 214, the holders 215, and the transparent-plate holders 216 are integrated into one by way of the first hole sections 116 and second hole sections 117. Therefore, the housing resin portion 210 that is divided in cross section of line A-A of the housing 10 is integrated into one in the cross section of line B-B of the housing 10, so it is possible to improve the flow of resin during insert molding, and molding can be performed stably at low injection pressure. As a result, it is possible to improve the precision of the relative positions of the object being read that is placed on the transparent-plate 9, the sensor 16 and the lens 15.

As illustrated in FIG. 13, in the cross section of line C-C of the housing 10, the housing resin portion 210 has two components; the transparent-plate holders 216 and the lens holder 212. As illustrated in FIG. 9, the sensor-board holders 214a are provided so as to be separated at uniform intervals in the X-axis direction (main scanning direction). As a result, because the linear expansion coefficients of the housing resin portion 210 and the housing metal portion 110 are different, it is possible to reduce the stress that occurs when the temperature changes. Consequently, it is possible to form a housing 10 that is capable of handling well changes in temperature. Moreover, it is possible to improve the precision of the relative positions of the object being read that is placed on the transparent-plate 9, the sensor 16, and the lens 15.

In FIG. 11 to FIG. 13, the lens holder 212 is formed so as to pass through the slit section 112 and continues until it reaches the sensor board 17. Therefore, it is possible to prevent divergence of the optical axis and to suppress stray light.

As was described above, in the first embodiment, the housing 10 comprises a housing metal portion 110 and housing resin portion 210 that are integrally formed. As a result, an image sensor S1 is obtained having a housing 10 that has good heat dissipation, suppresses distortion, and has a highly precise shape.

Second Embodiment

Figure 16:
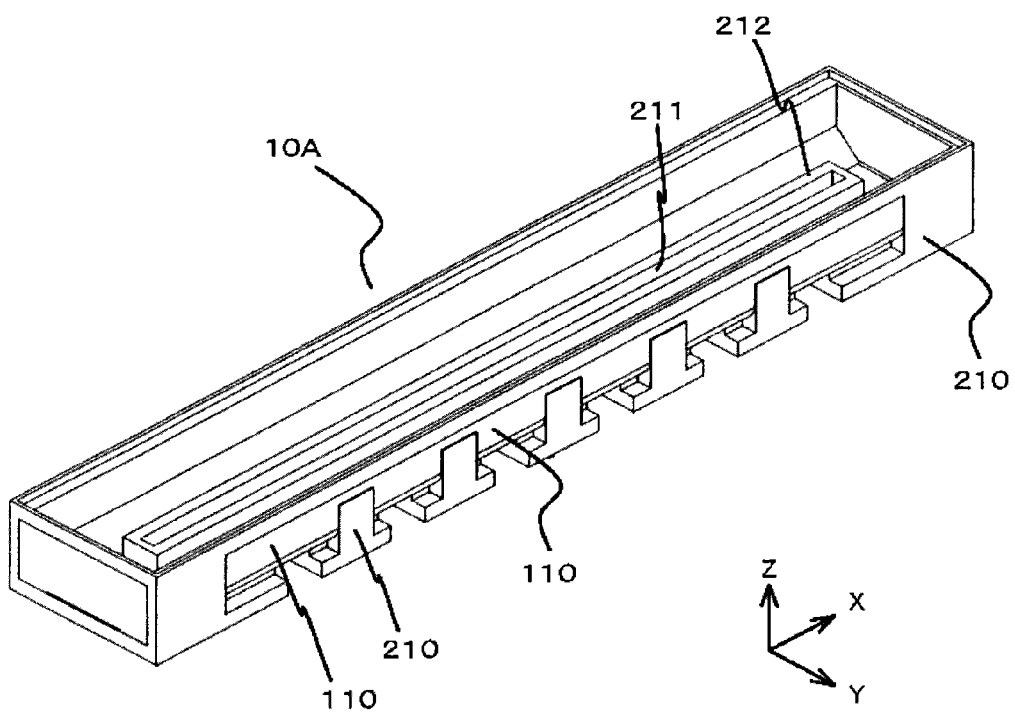
FIG. 16 is a view of the housing of the image sensor of a second embodiment of the present disclosure as seen from the irradiated side.
Figure 17:
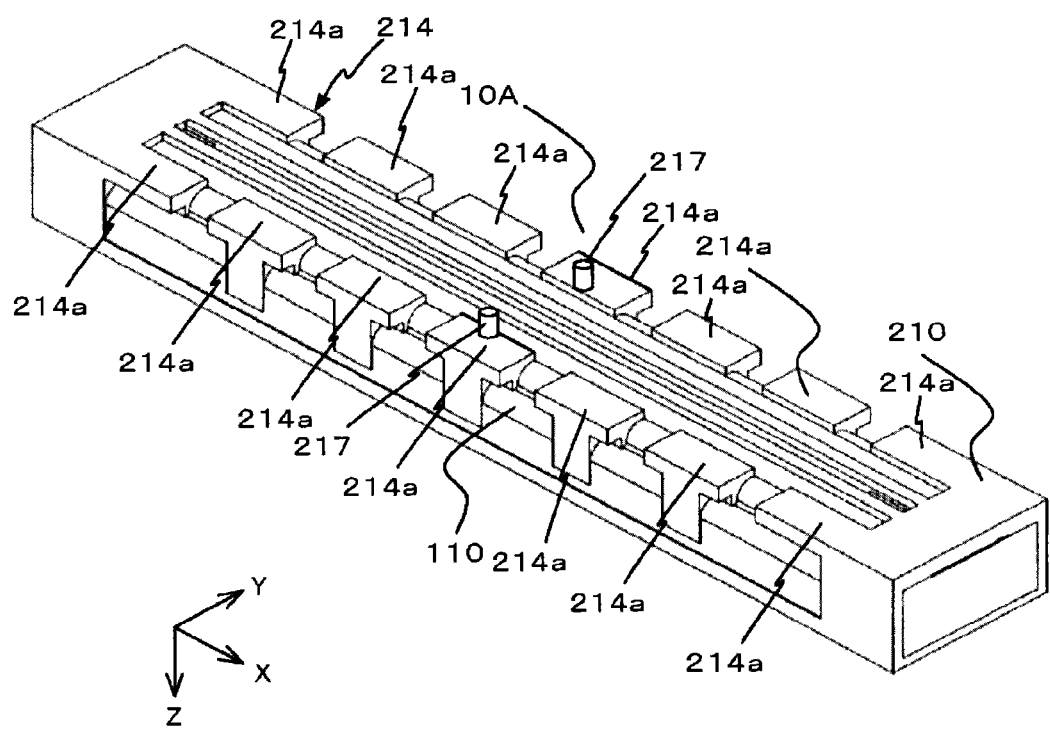
FIG. 17 is a view of the housing of the image sensor of the second embodiment of the present disclosure as seen from the rear surface.
Figure 18:
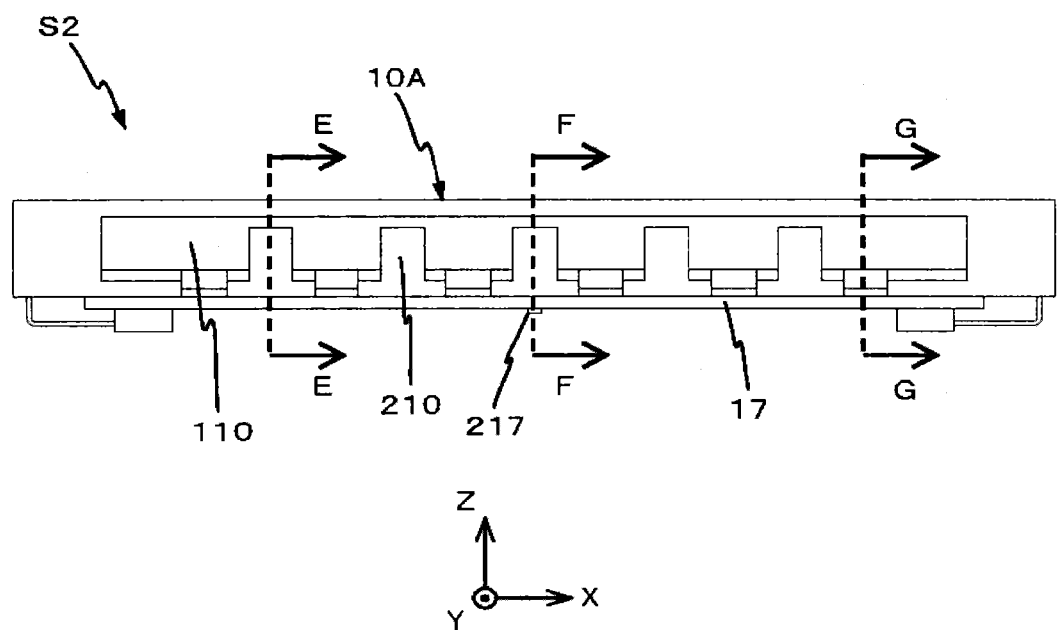
FIG. 18 is a side view of the image sensor of the second embodiment of the present disclosure.

Next, an image sensor S2 of a second embodiment of the present disclosure will be explained using FIG. 16 to FIG. 21. FIG. 16 is a perspective view of the housing 10A of the image sensor S2 of the second embodiment as seen from the irradiated side. FIG. 17 is a perspective view of the housing 10A of the image sensor S2 of the second embodiment as seen from the rear surface. FIG. 18 is a side view of the image sensor S2 of the second embodiment.

The image sensor S2 of the second embodiment differs from the image sensor S1 of the first embodiment in that the construction of the housing 10A differs from that of the housing 10 explained in the first embodiment.

The housing 10A, as illustrated in FIG. 16 and FIG. 17, is formed into a rectangular parallelepiped shape with the lengthwise direction being the X-axis direction (main scanning direction). The housing 10A comprises a housing metal portion 110 and a housing resin portion 210. The housing 10A is an insert-molded body that is formed by insert molding of the housing resin portion 210 in the housing metal portion 110.

Figure 19:
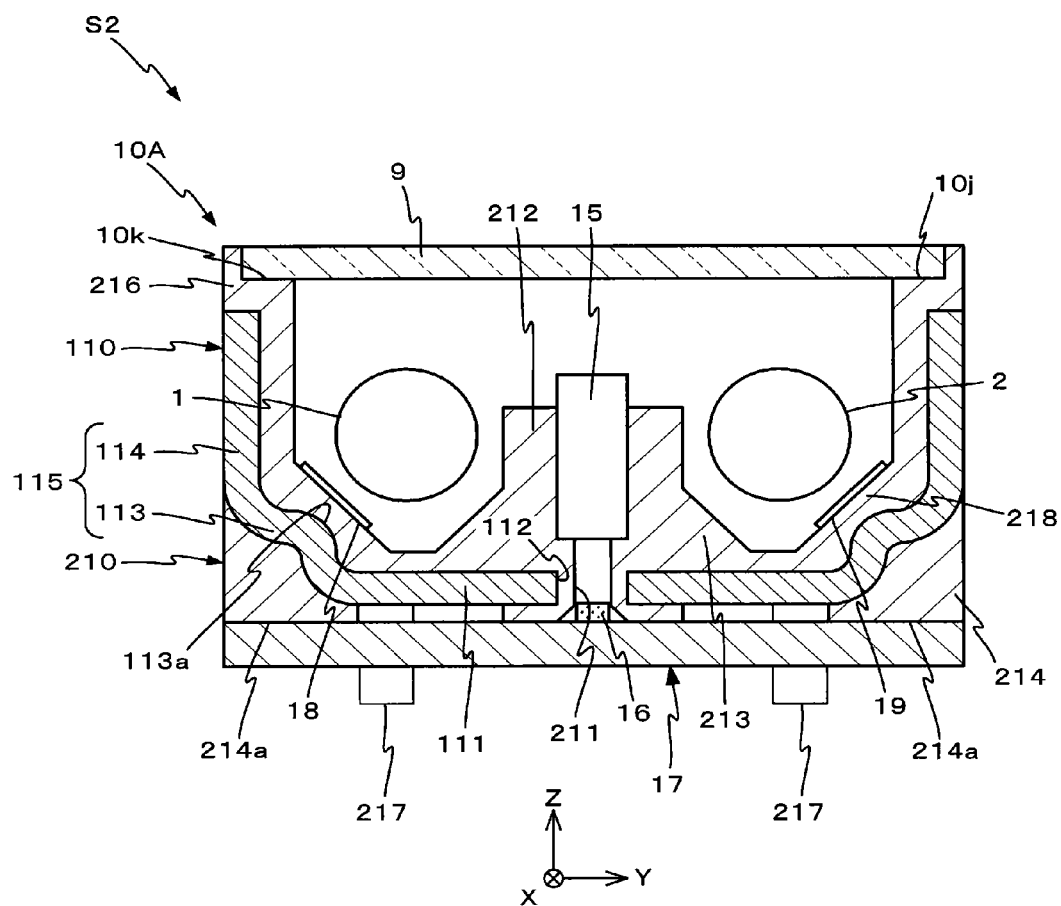
FIG. 19 is a cross-sectional view of line E-E in FIG. 18.
Figure 20:
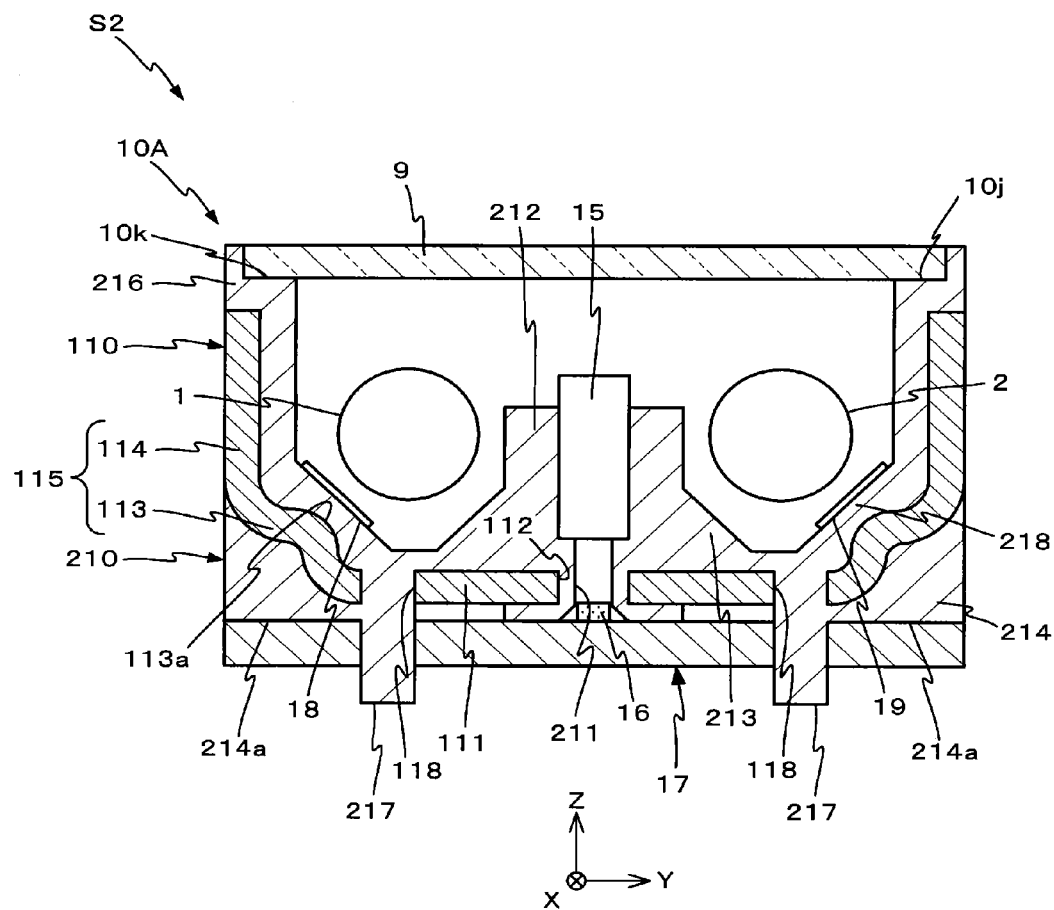
FIG. 20 is a cross-sectional view of line F-F in FIG. 18.
Figure 21:
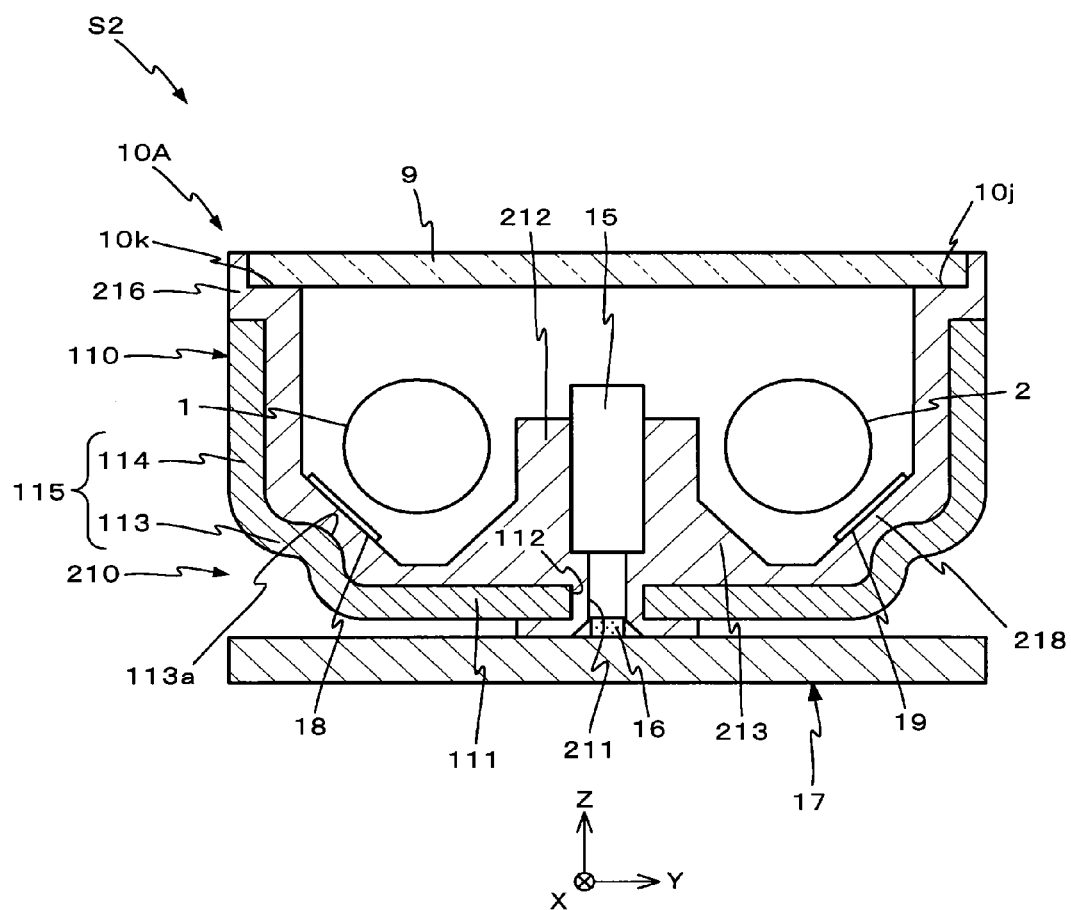
FIG. 21 is a cross-sectional view of line G-G in FIG. 18.

FIG. 19 is a cross-sectional view of line E-E in FIG. 18. FIG. 20 is a cross-sectional view of line F-F in FIG. 18. FIG. 21 is a cross-sectional view of line G-G in FIG. 18. As illustrated in FIG. 18 to FIG. 21, the housing metal portion 110 is formed into a U shape in the YZ cross section. The housing metal portion 110 comprises a first bottom section 111 in the center of the U shape, and sidewall sections 115 that are formed on the both sides (+Y side and −Y side) of the first bottom section 111.

The first bottom section 111 is formed so as to extend in the X-axis direction (main scanning direction). A slit section 112 is formed in the first bottom section 111. The slit section 112 is formed so as to extend in the X-axis direction. As illustrated in FIG. 20, openings 118 are formed in the first bottom section 111 so as to pass through in the Y-axis direction. The openings 118 are formed so as to have a circular cross section. In the second embodiment, two openings 118 are formed.

As illustrated in FIG. 19 to FIG. 21, the sidewall sections 115 are bent toward the top side (+Z side) from both ends of the first bottom section 111. Each sidewall section 115 comprises a first sidewall 113 and a second sidewall 114. The sidewall sections 115 are formed so as to extend in the X-axis direction.

The first sidewall 113 is formed into a wave shape that curves such that the YZ cross section is uneven. More specifically, the first sidewall 113 is formed into a wave shape that has a convex section 113a that is convex toward the inside.

The second sidewall 114 is formed so as to be orthogonal to the first bottom section 111.

The housing resin portion 210 comprises a lens holder 212, reinforcing sections 213 on both sides (+Y side and −Y side) of the lens holder 212, reflection-plate-installation sections 218, transparent-plate holders 216, a second bottom section 214 and gates 217.

The lens holder 212 comes in close contact with the slit section 112 of the housing metal portion 110. The lens holder 212 is formed so as to protrude toward the top side (+Z side) from the second bottoms section 214. The lens holder 212, as illustrated in FIG. 16, is formed so as to linearly extend in the X-axis direction. An opening 211 is formed along the X-axis direction in this lens holder 212. The opening 211, as illustrated in FIG. 19 to FIG. 21, is formed such that opening width is smaller than the opening width (opening width in the Y-axis direction) of the slit section 112 of the housing metal portion 110. The opening 211 is a through hole that passes through in the Z-axis direction. The lens 15 is fitted inside this opening 211 from the top side.

The reinforcing sections 213 are formed near the bottom end of the lens holder 212. The reinforcing sections 213 are formed so as to linearly extend in the X-axis direction along the lens holder 212. The reinforcing sections 213 are formed for maintaining the strength of the lens holder 212.

The reflection-plate-installation sections 218 are formed so as to be continuous with the reinforcing sections 213. The reflection-plate-installation sections 218 are formed on the inside of the sidewall sections 115. The surfaces of the reflection-plate-installation sections 218 are formed as inclined surfaces that incline with respect to the XY plane. Reflection plates 18, 19 are installed on the reflection-plate-installation sections 218. As illustrated in FIG. 11 to FIG. 13, in the first embodiment described above, the reflection plates 18, 19 were installed on reflection-plate-installation surfaces 10a, 10b, which were part of the housing metal portion 110. In contrast, in the second embodiment, as illustrated in FIG. 19 to FIG. 21, the reflection plates 18, 19 are installed on the reflection-plate-installation sections 218, which are part of the housing resin portion 210.

The transparent-plate holders 216 are formed so as to be continuous with the reflection-plate-installation sections 218. The transparent-plate holders 216 come in close contact with the inside and end sections of the second sidewalls 114. The transparent-plate holders 216 extend in the main scanning direction. The transparent-plate 9 is placed on the housing edge sections on the top ends of the transparent-plate holders 216. More specifically, the transparent-plate 9 is fitted in the stepped portions 10j, 10k of the housing 10.

The second bottom section 214 covers the first bottom section 111 of the housing metal portion 110 with part exposed. The sensor board 17 is attached to and supported by the bottom surface (surface on the −Z side) of the second bottom section 214. The sensor board 17, for example, is fastened by a fastening means such as screws. When the sensor board 17 is attached to the bottom surface of the second bottom section 214, the sensor 16 of the sensor board 17 is inserted into the opening 211. As illustrated in FIG. 17, the second bottom section 214 also has plural sensor-board holders 214a. The sensor-board holders 214a are provided so as to be separated at uniform intervals along the X-axis direction (main scanning direction).

The gates 217, as illustrated in FIG. 17, FIG. 18 and FIG. 20, are formed so as to protrude from the bottom surface of the second bottom section 214. The gates 217 are formed into a circular column shape. In this embodiment, two gates 217 are formed. The gates 217 are formed so that the center axes thereof respectively coincide with the center axes of the openings 118 that is formed in the first bottom section 111 of the housing metal portion 110. The gates 217 are also formed so that the outer diameters thereof are the same as the inner diameters of the openings 118. The gates 217 are inserted into holes 17a in the sensor board 17. The tip-end sections of the gates 217 are exposed from the bottom surface of the sensor board 17.

As explained above, in this embodiment, the housing metal portion 110 and the housing resin portion 210 are integrally formed. As a result, an image sensor S2 is obtained that has a housing 10A that has good heat dissipation, suppresses distortion, and has a highly precise shape.

Moreover, in this embodiment, the housing resin portion 210 comprises the transparent-plate holders 216, the sensor-board holders 214a, and the lens holder 212. Therefore, it is possible to adjust the transparent-plate 9, sensor 16 and lens 15 by each of components at three locations, or in other words, by the transparent-plate holders 216, the sensor-board holders 214a, and the lens holder 212, and thus it is possible to improve the precision of the relative positions of the object being read that is placed on the transparent-plate 9, the sensor 16 and the lens 15. As a result, it is possible to improve the precision of the focal position. During insert molding of the housing 10A, each of these three components is caused to bend in a concave direction with respect to the respective surfaces that come in contact with the housing metal portion 110. Therefore, by adjusting the contact surface area of these three components and the housing metal portion 110, it is possible to adjust the amount of deformation in the X and Z directions of the housing 10A. Consequently, it is possible to suppress bending in the main scanning direction in the housing 10A.

Moreover, it is possible to adjust the position of the transparent-plate 9, the position of the sensor 16 and the position of the lens 15 by each of components at three locations, that is, by the transparent-plate holders 216, the sensor-board holders 214a, and the lens holder 212, and thus it is possible to improve the precision of the relative positions of the object being read that is placed on the transparent-plate 9, the sensor 16 and the lens 15.

Figure 22A:
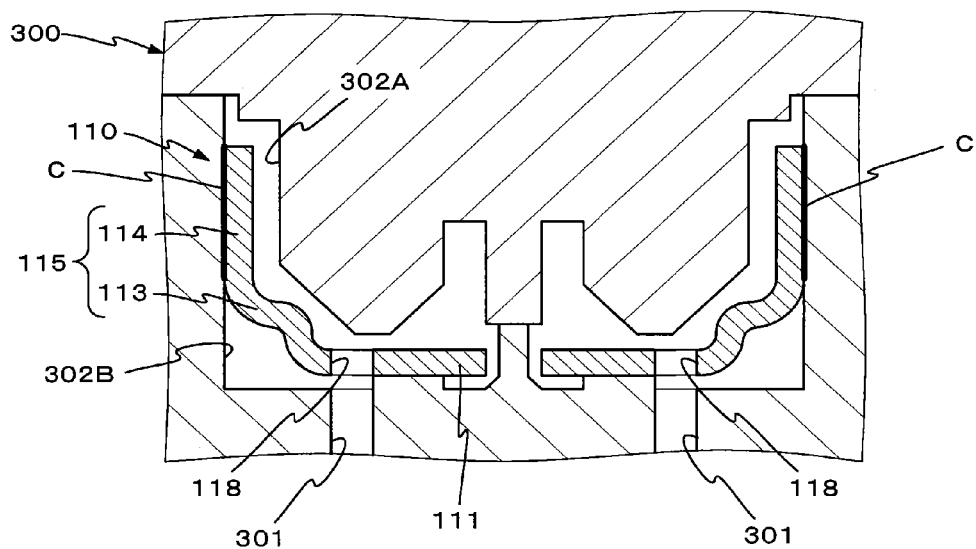
FIG. 22A is a cross-sectional view for explaining the application of the image sensor of the second embodiment of the present disclosure (1/2)

Furthermore, in this embodiment, as illustrated in FIG. 20, openings 118 are formed in the housing metal portion 110 of the housing 10A. The openings 118 are formed such that the center axes thereof coincide with the center axes of the gates 217. Therefore, as illustrated in FIG. 22A and FIG. 22B, when performing insert molding of the housing 10A, the molten resin R that is injected from the resin injection opening 301 preferentially flows as indicated by the arrows A through the openings 118.

Figure 22B:
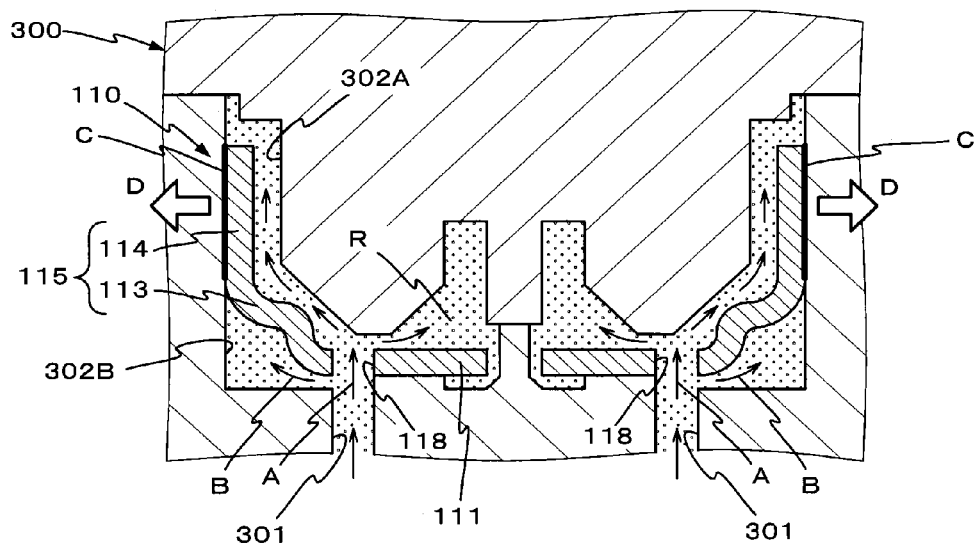
FIG. 22B is a cross-sectional view for explaining the application of the image sensor of the second embodiment of the present disclosure (2/2).

More specifically, the molten resin R that is injected from the resin injection openings 301 of the molding die 300 flows as illustrated by arrow A or arrow B in FIG. 22B into an inside cavities 302A that are formed on the inside of the housing metal portion 110 or outside cavities 302B that are formed on the outside. At this time, the openings 118 are formed so that the center axes respectively coincide with the center axes of the gates 217, so the amount of molten resin R that is flowing in the direction of arrow A is greater than the amount of molten resin R that is flowing in the direction of arrow B.

When the molten resin R flows into the inside cavities 302A, the internal pressure inside the inside cavities 302A increases. As a result, internal pressure acts such that the sidewall sections 115 of the housing metal portion 110 open up in a direction toward the outside as indicated by arrow D. Therefore, the space C between the sidewall sections 115 of the housing metal portion 110 and the molding die 300 becomes small. This makes it possible to form the housing 10A having highly precise dimensions regardless of differences in the dimensions of the housing metal portion 110 that is molded. As a result, an image sensor S2 having a housing 10A with a highly precise shape can be obtained.

Moreover, the space C between the sidewall sections 115 of the housing metal portion 110 and the molding die 300 becomes small, so it is possible to suppress the occurrence of burrs due to the space C. Therefore, it is possible to form a housing 10A having highly precise dimensions. As a result, an image sensor S2 having a housing 10A with a highly precise shape can be obtained.

In this embodiment, the first sidewalls 113 of the sidewall sections 115 of the housing metal portion 110, as illustrated in FIG. 19 to FIG. 21, are such that the YZ cross section is formed into a wave shape that is curved in an irregular shape. Therefore, it is difficult for twisting or bending to occur in the housing metal portion 110. Consequently, it is possible to improve the rigidity of the housing 10A. As a result, an image sensor S2 having a housing 10A with a highly precise shape can be obtained.

In this embodiment, the housing resin portion 210 comprises reinforcing sections 213 that reinforce the lens holder 212. Therefore, it is possible to improve the strength of the lens holder 212, and it is possible to improve the precision of the relative positions of the object being read that is placed on the transparent-plate 9, the sensor 16 and the lens 15.

Moreover, in this embodiment, convex sections 113a that are convex toward the inside are formed on the first sidewalls 113. Therefore, it is possible to make the thickness of the resin near the reflection-plate-installation sections 218 thin. As a result, it is possible to suppress shrinkage that occurs during insert molding. Therefore, it is possible to form a housing 10A having highly precise dimensions. As a result, an image sensor S2 having a housing 10A with a highly precise shape can be obtained.

Moreover, it is possible to suppress shrinkage that occurs in the resin near the reflection-plate-installation sections 218, so it is possible to install the reflection plates 18, 19 at the specified inclination angle with good precision. Therefore, an image sensor S2 having a housing 10A with a highly precise shape can be obtained.

Furthermore, in this embodiment, the sensor-board holders 214a are provided so as to be separated at specified intervals along the X-axis direction. Therefore, it is possible to reduce the stress that is generated during temperature changes due to differences in the linear expansion coefficients of the housing resin portion 210 and housing metal portion 110. As a result, an image sensor S2 having a housing 10A with a highly precise shape can be obtained.

First and second embodiments were explained above, however, the present disclosure is not limited to the embodiments described above.

For example, as illustrated in FIG. 20, the openings 118 that are formed in the housing metal portion 110 are formed so that the center axes coincide with the center axes of the gates 217. However, the embodiments are not limited to this, the openings 118 and gates 217 only need to be overlapped on the same axis. In this case as well, as can be seen from referencing FIG. 22A and FIG. 22B, when performing insert molding of the housing 10A, the molten resin R that is injected from the resin injection opening 301 preferentially flows in the direction indicated by arrow A.

The present disclosure can be embodied in various ways and can undergo various modifications without departing from the broad spirit and range of the disclosure. Moreover, the embodiments described above are for explaining the present disclosure, and do not limit the range of the disclosure.

This application is based on Japanese Patent Application No. 2012-108725 filed on May 10, 2012, and includes that specification, clams, drawings and abstract of that application. The disclosure of the patent application above is included in its entirety in this specification by reference.

INDUSTRIAL APPLICABILITY

The image sensor of the present disclosure is suitable for use in an image reading device such as a copier or multi-function printer, and is suitable for reading a target object.

REFERENCE SIGNS LIST

S1, S2 Image sensor, 1, 2 Light guide, 1a, 1b, 2a, 2b Protrusion (fitting), 1c, 1d, 2c, 2d End, 3, 4, 5, 6 Light source, 7, 8 Holder, 7a, 7b, 8a, 8b Insertion hole, 7c, 7d, 8c, 8d Surface, 7f, 7g, 8f, 8g Notch, 9 Transparent-plate (transparent-body), 10, 10A Housing, 10a, 10b Reflection-plate-installation surface, 10c, 10d Positioning surface (Z direction), 10e, 10f, 10g, 10h Positioning surface (Y direction), 10i Heat-transfer-body-contact surface, 10m Gate, 11, 12 Light-source board, 13, 14 Heat-transfer body, 15 Lens, 16 Sensor (light receiver), 17 Sensor board (light-receiver board), 17a Hole, 18, 19 Reflection plate, 20, 21 Holder fitting, 110 Housing metal portion, 111 First bottom section, 112 Slit section, 113 First sidewall, 113a Convex section, 114 Second sidewall, 115 Sidewall section, 116 First hole section, 117 Second hole section, 118 Opening (through hole), 210 Housing resin portion, 211 Opening, 212 Lens holder, 213 Reinforcing section, 214 Second bottom section, 214a Sensor-board holder, 215 Holder, 216 Transparent-plate holder (transparent-body holder), 217 Gate, 218 Reflection-plate-installation section, 300 Molding die, 301 Resin injection opening, 302A Inside cavity, 302B Outside cavity, R Molten resin, A, B, D Arrows, C Space.

The invention claimed is:

1. An image sensor, comprising:
a light guide that extends in a main scanning direction and that emits light onto an irradiated body;
a lens that focuses reflected light that has been reflected by the irradiated body;
a light receiver that receives the reflected light that was focused by the lens; and
a housing that houses or holds the light guide, the lens, and the light receiver, and that comprises a metal portion and a resin portion that are formed into one housing;
wherein
the metal portion comprises:
a first bottom section in which a slit section is formed in order for the reflected light that passed through the lens to pass through, and is formed that extends in the main scanning direction; and
the resin portion comprises:
a lens holder that has an opening formed therein, and by fitting the lens inside the opening, holds the lens; and
a second bottom section that has light-receiver-board holder that holds a light-receiver board on which the light receiver is mounted.

2. The image sensor according to claim 1, comprising:
a light source that provides light to the light guide;
a light-source board on which the light source is mounted on one surface thereof;
a heat-transfer body that is arranged so as to come in contact with the other surface on the opposite side from the one surface, and that comes in contact with at least part of the metal portion.

3. The image sensor according to claim 1, wherein plural light-receiver-board holders are provided along the main scanning direction so as to be separated at specified intervals.

4. The image sensor according to claim 1, wherein
the metal portion comprises:
a sidewall section that is bent toward the inside from both ends of the first bottom section; and
the sidewall section comprises:
a first sidewall that is bent toward the inside so as to be inclined with respect to the sub scanning direction at a specified angle from the first bottom section; and
a second sidewall that is continuous with the first sidewall and is bent toward the inside so as to be orthogonal to the first bottom section.

5. The image sensor according to claim 4, wherein the cross section of the first sidewall is formed into an arc shape.

6. The image sensor according to claim 4, wherein the cross section of the first sidewall is formed into a wave shape that is curved unevenly.

7. The image sensor according to claim 4, wherein the resin portion comprises a reinforcing section that, by being integrally formed with the lens holder, reinforces the lens holder.

8. The image sensor according to claim 7, wherein plural reinforcing sections are provided along the main scanning direction so as to be separated by specified intervals.

9. The image sensor according to claim 8, wherein
plural first hole sections are formed in the first bottom section to correspond to the positions where the reinforcing sections are formed; and
light-receiver-board holders are formed so as to be continuous from the reinforcing sections through the first hole sections.

10. The image sensor according to claim 4, wherein the resin portion comprises plural holders that are integrally formed with light-receiver-board holders and that hold the light-receiver-board holders.

11. The image sensor according to claim 10, wherein
the resin portion comprises:
a transparent-body holder that holds a transparent-body through which light from the light guide passes; and
plural second hole sections are formed in the sidewall section to correspond to the positions where the plural holders are formed; and
the transparent-body holder is formed so as to be continuous from the holders through the second hole sections.

12. The image sensor according to claim 7, wherein reinforcing sections extend along the main scanning direction.

13. The image sensor according to claim 12, wherein
the resin portion comprises:
a reflection-plate-installation section that is formed on the inside of the sidewall section; and
a transparent-body holder that holds a transparent-body through which light from the light guide passes; and
the reflection-plate-installation section is formed so as to be continuous with the reinforcing sections, and the transparent-body holder is formed so as to be continuous from the reflection-plate-installation section; and
light-receiver-board holders are formed on the outside of the sidewall section.

14. The image sensor according to claim 1, comprising a transparent-body that allows light from the light guide to pass through and be irradiated on to the irradiated body; wherein
the housing houses or holds the transparent-body together with the light guide, the lens, and the light receiver.

15. The image sensor according to claim 1, wherein the housing is an insert molded body comprising the metal portion and the resin portion.

16. The image sensor according to claim 1 comprising a light-receiver board on which the light receiver is mounted and in which a hole section is formed; wherein
 a gate that is inserted in the hole section is formed on the housing.

17. The image sensor according to claim 1, comprising
 a holder in which end section of the light guide is inserted and that hold the light guide; and
 a holder fitting is formed in the housing in a shape such that the holder can be fitted inside.

18. An image sensor, comprising:
 a light guide that extends in a main scanning direction and that emits light onto an irradiated body;
 a lens that focuses reflected light that has been reflected by the irradiated body;
 a light receiver that receives the reflected light that was focused by the lens; and
 a housing that houses or holds the light guide, the lens, and the light receiver, and that comprises a metal portion and a resin portion that are formed into one housing, wherein
 a light-receiver board on which the light receiver is mounted and in which a hole section is formed; and
 a gate that is inserted in the hole section is formed on the housing.

19. The image sensor according to claim 18, wherein a through hole is formed in the metal portion so as to overlap the gate on the same axes.

20. The image sensor according to claim 19, wherein the center axes of the gate and the center axes of the through hole coincide.

* * * * *